US012105159B2

United States Patent
Kimura et al.

(10) Patent No.: US 12,105,159 B2
(45) Date of Patent: Oct. 1, 2024

(54) EXTERNAL FIELD RESPONSE DISTRIBUTION VISUALIZATION DEVICE AND EXTERNAL FIELD RESPONSE DISTRIBUTION VISUALIZATION METHOD

(71) Applicants: NATIONAL UNIVERSITY CORPORATION KOBE UNIVERSITY, Hyogo (JP); Integral Geometry Science Inc., Hyogo (JP)

(72) Inventors: Kenjiro Kimura, Hyogo (JP); Yuki Mima, Hyogo (JP); Shogo Suzuki, Hyogo (JP); Noriaki Kimura, Hyogo (JP)

(73) Assignees: NATIONAL UNIVERSITY CORPORATION KOBE UNIVERSITY, Hyogo (JP); Integral Geometry Science Inc., Hyogo (JP)

( * ) Notice: Subject to any disclaimer, the term of this patent is extended or adjusted under 35 U.S.C. 154(b) by 67 days.

(21) Appl. No.: 17/776,121

(22) PCT Filed: Nov. 27, 2020

(86) PCT No.: PCT/JP2020/044193
§ 371 (c)(1),
(2) Date: May 11, 2022

(87) PCT Pub. No.: WO2021/107085
PCT Pub. Date: Jun. 3, 2021

(65) Prior Publication Data
US 2022/0413066 A1 Dec. 29, 2022

(30) Foreign Application Priority Data
Nov. 28, 2019 (JP) .................................. 2019-215478

(51) Int. Cl.
*G01R 33/00* (2006.01)
*G01R 33/10* (2006.01)

(52) U.S. Cl.
CPC ......... *G01R 33/0023* (2013.01); *G01R 33/10* (2013.01)

(58) Field of Classification Search
CPC .. G01R 33/0023; G01R 33/10; G01R 33/063; G01R 33/098; G01R 33/16; G01V 3/08
(Continued)

(56) References Cited

U.S. PATENT DOCUMENTS 6,714,008 B1 * 3/2004 Holmes ................ G01R 33/022
324/261
10,114,082 B1 * 10/2018 Derego .................. G01R 33/02
(Continued)

FOREIGN PATENT DOCUMENTS

| EP | 2332463 A1 | 6/2011 |
| JP | 2012-110470 A | 6/2012 |
| WO | 2008/123432 | 10/2008 |

OTHER PUBLICATIONS

Korjenevsky, Alexander V., and Vladimir A. Cherepenin. "Progress in realization of magnetic induction tomography." Annals of the New York Academy of Sciences 873.1 (1999): 346-352. (Year: 1999).*

(Continued)

*Primary Examiner* — Christopher P McAndrew
(74) *Attorney, Agent, or Firm* — Wenderoth, Lind & Ponack, L.L.P.

(57) ABSTRACT

An external field response distribution visualization device includes: an induction circuit that induces a first field component from each of induction positions; a sensor that senses a field strength at sensing positions for each of the induction positions; and an information processing circuit
(Continued)

that generates an image showing an external field response distribution. The information processing circuit: calculates, using the sensing result as a boundary condition, an induction position dependent field function that takes an induction and sensing positions as inputs and outputs the field strength; calculates an imaging function that takes an imaging target position as an input and outputs an image intensity, and is defined based on the strength output from the induction position dependent field function in response to inputting the imaging target position; and generates the image based on the imaging function.

20 Claims, 18 Drawing Sheets

(58) Field of Classification Search
USPC .......................................................... 324/244
See application file for complete search history.

(56) References Cited

U.S. PATENT DOCUMENTS

| | | | |
|---|---|---|---|
| 10,416,244 B2* | 9/2019 | Allee | G01R 33/072 |
| 10,502,802 B1* | 12/2019 | Kadin | G01R 33/543 |
| 2010/0219819 A1* | 9/2010 | Kimura | G01R 33/0206 |
| | | | 850/46 |
| 2017/0038440 A1 | 2/2017 | Verfaeke et al. | |
| 2018/0328887 A1 | 11/2018 | Kimura et al. | |

OTHER PUBLICATIONS

Gao, Yongxin, et al. "Induced electromagnetic field by seismic waves in Earth's magnetic field." Journal of Geophysical Research: Solid Earth 119.7 (2014): 5651-5685. (Year: 2014).*

International Search Report (ISR) issued on Feb. 16, 2021 in International (PCT) Application No. PCT/JP2020/044193.

Extended European Search Report issued Nov. 24, 2023 in corresponding European Patent Application No. 20894576.6, 9 pages.

* cited by examiner

EXTERNAL FIELD RESPONSE DISTRIBUTION VISUALIZATION DEVICE AND EXTERNAL FIELD RESPONSE DISTRIBUTION VISUALIZATION METHOD

TECHNICAL FIELD

The present disclosure relates to an external field response distribution visualization device and the like that generates an image showing an external field response distribution.

BACKGROUND ART

Patent Literature (PTL) 1 discloses a device that obtains a field by measurement. The device obtains a magnetic force image of a distribution of magnetic force in a first measurement plane above a sample, obtains an auxiliary magnetic force image by performing measurement in a second measurement plane, which is a minute distance d away from the first measurement plane, and then obtains a magnetic force gradient image by dividing the difference between them by the minute distance d. The magnetic force image and the auxiliary magnetic force image are Fourier transformed and substituted into a three-dimensional field obtaining equation derived from a general solution of the Laplace equation to obtain the three-dimensional field indicating the magnetic force.

The device disclosed in PTL 1 can obtain the state of the magnetic domains at the surface of the sample with high accuracy by obtaining the three-dimensional field.

CITATION LIST

Patent Literature

[PTL 1] WO 2008/123432

SUMMARY OF INVENTION

Technical Problem

However, the device disclosed in PTL 1 is only capable of obtaining the magnetic domains at the surface of a sample. It is difficult to obtain the state of the magnetic domains at depths deeper than the surface of the sample. Stated differently, it is difficult to obtain the magnetic susceptibility distribution (i.e., the external field response distribution) of the interior of the sample.

In view of this, the present disclosure provides an external field response distribution visualization device and the like that can generate an image showing the external field response distribution of an area including the interior of an object with high accuracy.

Solution to Problem

An external field response distribution visualization device according to one aspect of the present disclosure generates an image showing an external field response distribution, which is a distribution of responses to an external field, and includes: an induction circuit that induces a first field component from each of induction positions defined outside of an object as positions relative to the object; a sensor that senses, at each of sensing positions defined outside of the object as positions relative to the object, a strength of a field including a second field component induced from the object by the first field component, to sense the strength of the field at the sensing positions for each of the induction positions; and an information processing circuit that obtains a sensing result of the strength of the field and generates the image showing the external field response distribution of an area including an interior of the object based on the sensing result. The information processing circuit: calculates an induction position dependent field function that takes a virtual induction position and a virtual sensing position as inputs and outputs a strength of the field at the virtual sensing position, using the sensing result as a boundary condition; calculates an imaging function that takes an imaging target position as an input and outputs an image intensity at the imaging target position, and is defined based on a strength output from the induction position dependent field function in response to inputting the imaging target position, as the virtual induction position and the virtual sensing position, into the induction position dependent field function; and generates the image based on the imaging function.

These general or specific aspects may be implemented as a system, a device or apparatus, a method, an integrated circuit, a computer program, or a non-transitory computer-readable recording medium such a CD-ROM, or any combination thereof.

Advantageous Effects of Invention

According to one aspect of the present disclosure, it is possible to generate an image showing the external field response distribution in an area including the interior of an object with high accuracy.

DESCRIPTION OF EMBODIMENTS

Figure 1:
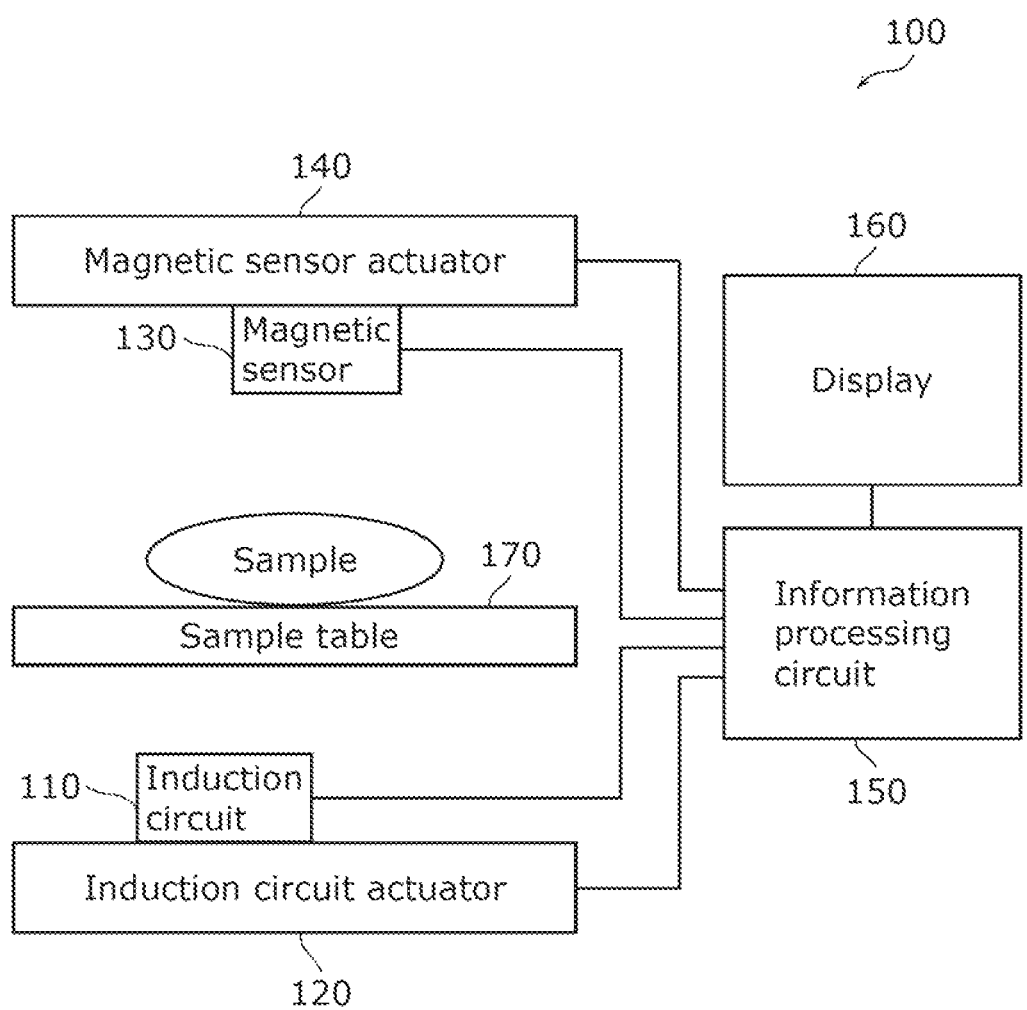
FIG. 1 is a configuration diagram of a first example of a magnetic susceptibility distribution visualization device according to an embodiment of the present disclosure.

For example, an external field response distribution visualization device according to one aspect of the present disclosure generates an image showing an external field response distribution, which is a distribution of responses to an external field, and includes: an induction circuit that induces a first field component from each of induction positions defined outside of an object as positions relative to the object; a sensor that senses, at each of sensing positions defined outside of the object as positions relative to the object, a strength of a field including a second field component induced from the object by the first field component, to sense the strength of the field at the sensing positions for each of the induction positions; and an information processing circuit that obtains a sensing result of the strength of the field and generates the image showing the external field response distribution of an area including an interior of the object based on the sensing result. The information processing circuit: calculates an induction position dependent field function that takes a virtual induction position and a virtual sensing position as inputs and outputs a strength of the field at the virtual sensing position, using the sensing result as a boundary condition; calculates an imaging function that takes an imaging target position as an input and outputs an image intensity at the imaging target position, and is defined based on a strength output from the induction position dependent field function in response to inputting the imaging target position, as the virtual induction position and the virtual sensing position, into the induction position dependent field function; and generates the image based on the imaging function.

This enables the external field response distribution visualization device to generate an image showing the external field response distribution of an area including the interior of the object with high accuracy based on the sensing result of the strength of the field based on various combinations of the induction positions and the sensing positions.

For example, the information processing circuit calculates, as the induction position dependent field function, a solution of a Laplace equation which the induction position dependent field function satisfies, using the sensing result as the boundary condition.

This enables the external field response distribution visualization device to properly derive the induction position dependent field function based on the sensing result and the Laplace equation related to the multipath problem in a static or quasi-static field.

For example, the information processing circuit calculates, as the imaging function, a limit value of the induction position dependent field function, by performing a limit operation on the induction position dependent field function that directs the virtual induction position and the virtual sensing position input into the induction position dependent field function toward the imaging target position.

This enables the external field response distribution visualization device to properly derive the imaging function based on the induction position dependent field function.

For example, the induction positions are defined in a first plane, and the sensing positions are defined in a second plane that is the same as or different than the first plane.

This enables the external field response distribution visualization device to inhibit an increase in the size of the space required to place the induction circuit and sensor. The external field response distribution visualization device can also inhibit complication of the calculation process.

For example, the sensing positions are located on a first side of the object and the induction positions are on a second opposite side of the object.

This enables the external field response distribution visualization device to sense the strength of the field at each of the sensing positions, which are on the opposite side of the object relative to the induction positions. Accordingly, the external field response distribution visualization device can inhibit the influence of the first field component induced by the induction circuit when sensing the strength of the field at each of the sensing positions.

For example, the sensing positions and the induction positions are located on the same side of the object.

This enables the external field response distribution visualization device to sense the strength of the field at each of the sensing positions, which are on the same side of the object as the induction positions. This enables the external field response distribution visualization device to inhibit an increase in the size of the space required to place the induction circuit and sensor.

For example, the induction circuit induces the first field component from each of the induction positions by moving to each of the induction positions, and the sensor senses the strength of the field at each of the sensing positions by moving to each of the sensing positions.

This enables the external field response distribution visualization device to implement one induction circuit for a plurality of induction positions and one sensor for a plurality of sensing positions. Accordingly, the external field response distribution visualization device can inhibit an increase in resource cost.

For example, the induction circuit comprises a plurality of induction circuits disposed at the induction positions, and the sensor comprises a plurality of sensors disposed at the sensing positions.

This enables the external field response distribution visualization device to induce a field component from each of the induction positions without moving the induction circuit or sensor, and to sense the strength of the field at each of the sensing positions. Accordingly, the external field response distribution visualization device can rapidly obtain the sensing result corresponding to a plurality of induction positions and a plurality of sensing positions.

For example, the plurality of induction circuits are disposed in a first plane, and the plurality of sensors are disposed in a second plane that is the same as or different than the first plane.

This enables the external field response distribution visualization device to rapidly obtain the sensing result corresponding to the induction positions in the first plane and the sensing positions in the second plane.

For example, the plurality of induction circuits are disposed on a first straight line, and the plurality of sensors are disposed on a second straight line that is the same as or different than the first straight line.

This enables the external field response distribution visualization device to reduce the space where the induction circuits are disposed and the space where the sensors are disposed.

For example, the object moves, the induction circuit induces the first field component from each of the induction positions defined relative to the object that moves, by inducing the first field component from a predetermined position at different times, and the sensor senses the strength of the field at each of the sensing positions defined relative to the object that moves, by sensing the strength of the field at a predetermined position at different times.

This enables the external field response distribution visualization device to induce a field component from each of the induction positions without providing many induction circuits or many sensors and without moving the induction circuit or sensor, and to sense the strength of the field at each of the sensing positions.

For example, the induction circuit is included in a first wall, and the sensor is included in a second wall that is the same as or different than the first wall.

This enables the external field response distribution visualization device to generate an image showing the external field response distribution without being noticed by people.

For example, the induction circuit and the sensor are included in a floor.

This enables the external field response distribution visualization device to generate an image showing the external field response distribution without being noticed by people.

For example, the induction circuit is included in a first pole, and the sensor is included in a second pole that is the same as or different than the first pole.

This enables the external field response distribution visualization device to generate an image showing the external field response distribution without being noticed by people.

For example, in a three-dimensional space of x-coordinates, y-coordinates, and z-coordinates, the virtual induction position is expressed as $(y_1, z_1)$, the virtual sensing position is expressed as $(x, y_2, z_2)$, a z-coordinate of a position of the induction circuit is defined as 0, and a z-coordinate of a position of the sensor is defined as $z_0$, the induction position dependent field function is defined as:

[Math. 1]

$$\Phi(x, y_1, y_2, z_1, z_2) = \int_{-\infty}^{\infty}\int_{-\infty}^{\infty}\int_{-\infty}^{\infty} a(k_x, k_{y_1}, k_{y_2}) e^{ik_x x + ik_{y_1} y_1 + ik_{y_2} y_2} e^{k_{y_1} z_1 - \sqrt{k_x^2 + k_{y_2}^2}\, z_2} dk_x dk_{y_1} dk_{y_2},$$

$$a(k_x, k_{y_1}, k_{y_2}) = e^{z_0 \sqrt{k_x^2 + k_{y_2}^2}} \Phi(k_x, k_{y_1}, k_{y_2}, z_1 = 0, z_2 = z_0),$$

a Fourier transform image of the sensing result is expressed as:

$$\Phi(k_x, k_{y_1}, k_{y_2}, z_1 = 0, z_2 = z_0) \qquad \text{[Math. 2]}$$

where $k_x$, $k_{y_1}$, and $k_{y_2}$ are respective wavenumbers of x, $y_1$, and $y_2$, and the imaging function is defined as:

[Math. 3]

$$\varphi(x, y, z) = \lim_{\substack{y_2 \to y_1 = y \\ z_2 \to z_1 = z}} \Phi(x, y_1, y_2, z_1, z_2) = \lim_{\substack{y_2 \to y_1 = y \\ z_2 \to z_1 = z}}$$

$$\int_{-\infty}^{\infty}\int_{-\infty}^{\infty}\int_{-\infty}^{\infty} a(k_x, k_{y_1}, k_{y_2}) e^{ik_x x + ik_{y_1} y_1 + ik_{y_2} y_2} e^{k_{y_1} z_1 - \sqrt{k_x^2 + k_{y_2}^2}\, z_2} dk_x dk_{y_1} dk_{y_2}.$$

This enables the external field response distribution visualization device to generate an image showing the external field response distribution with high accuracy using the induction position dependent field function expressed in the equation above and the imaging function expressed in the equation above.

For example, in a three-dimensional space of x-coordinates, y-coordinates, and z-coordinates, the virtual induction position is expressed as $(y_1, z_1)$, the virtual sensing position is expressed as $(x, y_2, z_2)$, a z-coordinate of a position of the induction circuit is defined as 0, and a z-coordinate of a position of the sensor is defined as $z_0$, the induction position dependent field function is defined as:

[Math. 4]

$$\Phi(x, y_1, y_2, z_1, z_2) =$$

$$\int_{-\infty}^{\infty}\int_{-\infty}^{\infty}\int_{-\infty}^{\infty} a(k_x, k_{y_1}, k_{y_2}) e^{ik_x x + ik_{y_1} y_1 + ik_{y_2} y_2} e^{-k_{y_1} z_1 - \sqrt{k_x^2 + k_{y_2}^2}\, z_2} dk_x dk_{y_1} dk_{y_2},$$

$$a(k_x, k_{y_1}, k_{y_2}) = e^{z_0 \sqrt{k_x^2 + k_{y_2}^2}} \Phi(k_x, k_{y_1}, k_{y_2}, z_1 = 0, z_2 = z_0),$$

a Fourier transform image of the sensing result is expressed as:

$$\Phi(k_x, k_{y_1}, k_{y_2}, z_1 = 0, z_2 = z_0) \qquad \text{[Math. 5]}$$

where $k_x$, $k_{y_1}$, and $k_{y_2}$ are respective wavenumbers of x, $y_1$, and $y_2$, and the imaging function is defined as:

[Math. 6]

$$\varphi(x, y, z) = \lim_{\substack{y_2 \to y_1 = y \\ z_2 \to z_1 = z}} \Phi(x, y_1, y_2, z_1, z_2) = \lim_{\substack{y_2 \to y_1 = y \\ z_2 \to z_1 = z}}$$

$$\int_{-\infty}^{\infty}\int_{-\infty}^{\infty}\int_{-\infty}^{\infty} a(k_x, k_{y_1}, k_{y_2}) e^{ik_x x + ik_{y_1} y_1 + ik_{y_2} y_2} e^{-k_{y_1} z_1 - \sqrt{k_x^2 + k_{y_2}^2}\, z_2} dk_x dk_{y_1} dk_{y_2}.$$

This enables the external field response distribution visualization device to generate an image showing the external field response distribution with high accuracy using the induction position dependent field function expressed in the equation above and the imaging function expressed in the equation above.

For example, in a three-dimensional space of x-coordinates, y-coordinates, and z-coordinates, the virtual induction position is expressed as $(x_1, y, z_1)$, the virtual sensing position is expressed as $(x_2, y, z_2)$, a z-coordinate of a position of the induction circuit is defined as 0, and a z-coordinate of a position of the sensor is defined as $z_0$, the induction position dependent field function is defined as:

[Math. 7]

$$\Phi(x_1, x_2, y, z_1, z_2) =$$

$$\int_{-\infty}^{\infty}\int_{-\infty}^{\infty}\int_{-\infty}^{\infty} a(k_{x_1}, k_{x_2}, k_y) e^{ik_{x_1}x_1 + ik_{x_2}x_2 + ik_y y} e^{\sqrt{k_{x_1}^2 + k_y^2}z_1 - \sqrt{k_{x_2}^2 + k_y^2}z_2} dk_{x_1} dk_{x_2} dk_y,$$

$$a(k_{x_1}, k_{x_2}, k_y) = e^{z_0 \sqrt{k_{x_2}^2 + k_y^2}} \bar{\Phi}(k_{x_1}, k_{x_2}, k_y, z_1 = 0, z_2 = z_0),$$

a Fourier transform image of the sensing result is expressed as:

$$\bar{\Phi}(k_{x_1}, k_{x_2}, k_y, z_1=0, z_2=z_0) \quad \text{[Math. 8]}$$

where $k_{x_1}$, $k_{x_2}$, and $k_y$ are respective wavenumbers of $x_1$, $x_2$, and $y$, and the imaging function is defined as:

[Math. 9]

$$\varphi(x, y, z) = \lim_{\substack{x_2 \to x_1 = x \\ z_2 \to z_1 = z}} \Phi(x_1, x_2, y, z_1, z_2) = \lim_{\substack{x_2 \to x_1 = x \\ z_2 \to z_1 = z}}$$

$$\int_{-\infty}^{\infty}\int_{-\infty}^{\infty}\int_{-\infty}^{\infty} a(k_{x_1}, k_{x_2}, k_y) e^{ik_{x_1}x_1 + ik_{x_2}x_2 + ik_y y} e^{\sqrt{k_{x_1}^2 + k_y^2}z_1 - \sqrt{k_{x_2}^2 + k_y^2}z_2} dk_{x_1} dk_{x_2} dk_y.$$

This enables the external field response distribution visualization device to generate an image showing the external field response distribution with high accuracy using the induction position dependent field function expressed in the equation above and the imaging function expressed in the equation above.

For example, in a three-dimensional space of x-coordinates, y-coordinates, and z-coordinates, the virtual induction position is expressed as $(x_1, y, z_1)$, the virtual sensing position is expressed as $(x_2, y, z_2)$, a z-coordinate of a position of the induction circuit is defined as 0, and a z-coordinate of a position of the sensor is defined as $z_0$, the induction position dependent field function is defined as:

[Math. 10]

$$\Phi(x_1, x_2, y, z_1, z_2) = \int_{-\infty}^{\infty}\int_{-\infty}^{\infty}\int_{-\infty}^{\infty} a(k_{x_1}, k_{x_2}, k_y)$$

$$e^{ik_{x_1}x_1 + ik_{x_2}x_2 + ik_y y} e^{-\sqrt{k_{x_1}^2 + k_y^2}z_1 - \sqrt{k_{x_2}^2 + k_y^2}z_2} dk_{x_1} dk_{x_2} dk_y,$$

$$a(k_{x_1}, k_{x_2}, k_y) = e^{z_0 \sqrt{k_{x_2}^2 + k_y^2}} \bar{\Phi}(k_{x_1}, k_{x_2}, k_y, z_1 = 0, z_2 = z_0),$$

a Fourier transform image of the sensing result is expressed as:

$$\bar{\Phi}(k_{x_1}, k_{x_2}, k_y, z_1=0, z_2=z_0) \quad \text{[Math. 11]}$$

where $k_{x_1}$, $k_{x_2}$, and $k_y$ are respective wavenumbers of $x_1$, $x_2$, and $y$, and the imaging function is defined as:

[Math. 12]

$$\varphi(x, y, z) = \lim_{\substack{x_2 \to x_1 = x \\ z_2 \to z_1 = z}} \Phi(x_1, x_2, y, z_1, z_2) =$$

$$\lim_{\substack{x_2 \to x_1 = x \\ z_2 \to z_1 = z}} \int_{-\infty}^{\infty}\int_{-\infty}^{\infty}\int_{-\infty}^{\infty} a(k_{x_1}, k_{x_2}, k_y) e^{ik_{x_1}x_1 + ik_{x_2}x_2 + ik_y y}$$

$$e^{-\sqrt{k_{x_1}^2 + k_y^2}z_1 - \sqrt{k_{x_2}^2 + k_y^2}z_2} dk_{x_1} dk_{x_2} dk_y.$$

This enables the external field response distribution visualization device to generate an image showing the external field response distribution with high accuracy using the induction position dependent field function expressed in the equation above and the imaging function expressed in the equation above.

For example, the information processing circuit determines whether the object includes a detection target object based on the image, and when the object is determined to include the detection target object, outputs information indicating a location of the detection target object or the object to an external terminal.

This enables the external field response distribution visualization device to notify the location of a specific detection target object or the location of an object including a specific detection target object.

For example, an external field response distribution visualization method of generating an image showing an external field response distribution, which is a distribution of responses to an external field, includes: inducing, by an induction circuit, a first field component from each of induction positions defined outside of an object as positions relative to the object; sensing, by a sensor, at each of sensing positions defined outside of the object as positions relative to the object, a strength of a field including a second field component induced from the object by the first field component, to sense the strength of the field at the sensing positions for each of the induction positions; and obtaining a sensing result of the strength of the field and generating the image showing the external field response distribution of an area including an interior of the object based on the sensing result. The obtaining and generating includes: calculating an induction position dependent field function that takes a virtual induction position and a virtual sensing position as inputs and outputs a strength of the field at the virtual sensing position, using the sensing result as a boundary condition; calculating an imaging function that takes an imaging target position as an input and outputs an image intensity at the imaging target position, and is defined based on a strength output from the induction position dependent field function in response to inputting the imaging target position, as the virtual induction position and the virtual sensing position, into the induction position dependent field function; and generating the image based on the imaging function.

This makes it possible to generate an image showing the external field response distribution of an area including the interior of the object with high accuracy based on the sensing result of the strength of the field based on various combinations of the induction positions and the sensing positions.

Hereinafter, embodiments will be described with reference to the drawings. Each of the following embodiments describes a general or specific example. The numerical values, shapes, materials, elements, the arrangement and connection of the elements, steps, the order of the steps etc., presented in the following embodiments are mere examples, and do not limit the scope of the claims.

Hereinafter, mainly a magnetic susceptibility distribution visualization device that uses the magnetic field will be described as one example of an external field response distribution visualization device. The magnetic field components described below are the components that make up the magnetic field. The magnetic field components may be each of several magnetic fields superimposed on the overall magnetic field.

Embodiments

FIG. 1 is a configuration diagram of a first example of a magnetic susceptibility distribution visualization device according to the present embodiment. Magnetic susceptibility distribution visualization device 100 illustrated in FIG. 1 includes induction circuit 110, induction circuit actuator 120, magnetic sensor 130, magnetic sensor actuator 140, information processing circuit 150, display 160, and sample table 170. Magnetic susceptibility distribution visualization device 100 generates an image showing the magnetic susceptibility distribution of an area including the interior of the sample placed on sample table 170. This image can show magnetic material, more specifically ferromagnetic material, contained in the sample.

Induction circuit 110 is an electrical circuit that induces a magnetic field component. Induction circuit 110 may be a coil or a conductive line. Here, the magnetic field component induced by induction circuit 110 is referred to as a first magnetic field component. In the example illustrated in FIG. 1, induction circuit 110 moves. Induction circuit 110 therefore induces the first magnetic field component from each of induction positions. The first magnetic field component induces a magnetic field component from the sample. Here, the magnetic field component induced from the sample is referred to as a second magnetic field component.

Induction circuit actuator 120 is an actuator that moves induction circuit 110. Induction circuit actuator 120 moves induction circuit 110 to each of the induction positions. With this, induction circuit 110 induces the first magnetic field component from each of the induction positions.

Magnetic sensor 130 is a sensor that senses magnetism. Magnetic sensor 130 may be a tunneling magneto resistive (TMR) element, a giant magneto resistive (GMR) element, a superconducting quantum interference device (SQUID) element, or a magneto-impedance (MI) element.

In the example illustrated in FIG. 1, magnetic sensor 130 moves. Magnetic sensor 130 senses, at each of sensing positions, the magnetism in the magnetic field including the second magnetic field component induced by the sample. With this, magnetic sensor 130 senses magnetism at sensing positions for each of the induction positions.

Magnetic sensor actuator 140 is an actuator that moves magnetic sensor 130. Magnetic sensor actuator 140 moves magnetic sensor 130 to each of the sensing positions. With this, magnetic sensor 130 senses magnetism at each of the sensing positions.

Information processing circuit 150 is an electrical circuit that performs information processing. Information processing circuit 150 may be a computer or a processor of a computer, for example. Information processing circuit 150 obtains the magnetism sensing result and, based on the sensing result, generates an image showing the magnetic susceptibility distribution of an area including the interior of the sample.

More specifically, information processing circuit 150 calculates an induction position dependent magnetic field function using the sensing result as a boundary condition. The induction position dependent magnetic field function is a function that takes the induction position of the first magnetic field component and the magnetism sensing position as inputs, and outputs the magnetic strength at the sensing position.

Information processing circuit 150 then calculates an imaging function. The imaging function is a function that takes an imaging target position as an input, and outputs an image intensity at the imaging target position, and is defined based on the strength output from the induction position dependent magnetic field function in response to inputting the imaging target position, as the induction position and the sensing position, into the induction position dependent magnetic field function. Information processing circuit 150 then generates, based on the imaging function, an image showing the magnetic susceptibility distribution of an area including the interior of the sample.

Information processing circuit 150 may output the generated image to, for example, display 160. For example, information processing circuit 150 may display the image on display 160 by outputting the image to display 160. Alternatively, information processing circuit 150 may print the image via a printer (not illustrated in the drawings) by outputting the image to the printer. Alternatively, information processing circuit 150 may transmit the image as electronic data to another device (not illustrated in the drawings) via wired or wireless communication.

Display 160 is a display device such as a liquid crystal display. Note that display 160 is an optional component, not a required component. Display 160 may be an external device not included in magnetic susceptibility distribution visualization device 100.

Sample table 170 is a table on which a sample is placed. Note that sample table 170 is an optional component, not a required component. Magnetic susceptibility distribution visualization device 100 may generate an image for a sample that is not placed on sample table 170 or the like. Sample table 170 may be an external component not included in magnetic susceptibility distribution visualization device 100. The sample may be an electrical circuit or any other object.

Magnetic susceptibility distribution visualization device 100 senses the magnetism affected by the sample while changing the relative positional relationship between the sample, the induction position, and the sensing position. This enables magnetic susceptibility distribution visualization device 100 to obtain sufficient information on the magnetic susceptibility distribution of an area including the interior of the sample. Magnetic susceptibility distribution visualization device 100 can then calculate the induction position dependent magnetic field function based on the obtained sufficient information, and can generate an image showing the magnetic susceptibility distribution with high accuracy based on the calculated induction position dependent magnetic field function.

For example, magnetic susceptibility distribution visualization device 100 can generate a highly accurate image by combining multiple measurements corresponding to multiple combinations of induction positions and sensing positions.

Figure 2:
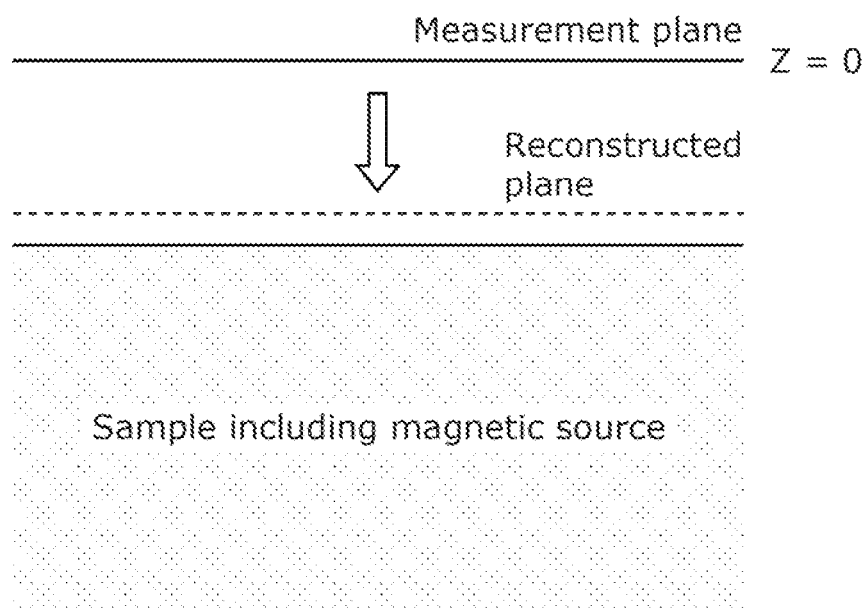
FIG. 2 is a schematic diagram illustrating the reconstruction of a magnetic field according to a reference example.

FIG. 2 is a schematic diagram illustrating the reconstruction of the magnetic field according to a reference example. A static magnetic field in a space where there is no magnetic source satisfies (1-1) shown below from Maxwell's equations.

[Math. 13]

$$\Delta H_z = 0 \tag{1-1}$$

$H_z$ in (1-1) above is the magnetic field in the z-direction in the xyz Cartesian coordinate system, and corresponds to the z-component of the magnetic field vector. $\Delta$ is the Laplacian, also known as the Laplace operator. The general solution to (1-1) above can be expressed as the sum of a term that increases exponentially in the z-direction and a term that attenuates exponentially in the z-direction, as illustrated in (1-2) below.

[Math. 14]

$$H_z(x, y, z) = \frac{1}{(2\pi)^2} \int\int e^{ik_x x + ik_y y} \left\{ a(k_x, k_y) e^{z\sqrt{k_x^2 + k_y^2}} + b(k_x, k_y) e^{-z\sqrt{k_x^2 + k_y^2}} \right\} dk_x dk_y \tag{1-2}$$

In (1-2) above, $k_x$ and $k_y$ represent the wavenumbers in the x- and y-directions, respectively. Also, $a(k_x, k_y)$ and $b(k_x, k_y)$ are functions expressed in terms of $k_x$ and $k_y$. For example, the measurement yields the z-component $H_z(x, y, 0)$ of the magnetic field vector in the plane of z=0, and the z-direction gradient $\partial/\partial z H_z(x, y, z)|_{z=0}$ of the z-component of the magnetic field vector. Using these, $a(k_x, k_y)$ and $b(k_x, k_y)$ in (1-2) can be obtained as illustrated in (1-3) and (1-4) below, respectively.

[Math. 15]

$$a(k_x, k_y) = \frac{1}{2}\left[f(k_x, k_y) + \frac{g(k_x, k_y)}{\sqrt{k_x^2 + k_y^2}}\right] \tag{1-3}$$

[Math. 16]

$$b(k_x, k_y) = \frac{1}{2}\left[f(k_x, k_y) - \frac{g(k_x, k_y)}{\sqrt{k_x^2 + k_y^2}}\right] \tag{1-4}$$

In (1-3) and (1-4) above, $f(k_x, k_y)$ is the two-dimensional Fourier transform image of $H_z(x, y, 0)$, and $g(k_x, k_y)$ is the two-dimensional Fourier transform image of $\partial/\partial z Hz(x, y, z)|_{z=0}$. By substituting (1-3) and (1-4) into (1-2), $H_z$ can be obtained as illustrated in (1-5) below.

[Math. 17]

$$H_z(x, y, z) = \frac{1}{(2\pi)^2} \int\int e^{ik_x x + ik_y y} \left\{ \frac{1}{2}\left(f(k_x, k_y) + \frac{g(k_x, k_y)}{\sqrt{k_x^2 + k_y^2}}\right) e^{z\sqrt{k_x^2 + k_y^2}} + \frac{1}{2}\left(f(k_x k_y) - \frac{g(k_x, k_y)}{\sqrt{k_x^2 + k_y^2}}\right) e^{-z\sqrt{k_x^2 + k_y^2}} \right\} dk_x dk_y \tag{1-5}$$

With the above method, it is possible to obtain $H_z(x, y, z)$ at any z-coordinate in space where there is no magnetic source using $H_z(x, y, 0)$, which is the Dirichlet boundary condition, and $\partial/\partial z H_z(x, y, z)|_{z=0}$, which is the Neumann boundary condition. This means that the magnetic field at the surface of the sample can be reconstructed from the magnetic field at the measurement plane, which is the xy plane at z=0.

However, the equations used in the above method are valid in a space where there is no magnetic source. Therefore, it is difficult to reconstruct the magnetic field deeper than the surface of the sample using only the above method. Stated differently, it is difficult to visualize the magnetic susceptibility distribution inside a sample including a magnetic source using the above method alone.

In contrast, magnetic susceptibility distribution visualization device 100 according to the present embodiment calculates the induction position dependent magnetic field function based on the sensing result obtained by sensing magnetism while changing the relative positional relationship between the sample, the induction position, and the sensing position. Magnetic susceptibility distribution visualization device 100 then generates an image showing the magnetic susceptibility distribution based on the induction position dependent magnetic field function. Stated differently, magnetic susceptibility distribution visualization device 100 can reconstruct the magnetic field deeper than the surface of the sample.

Figure 3:
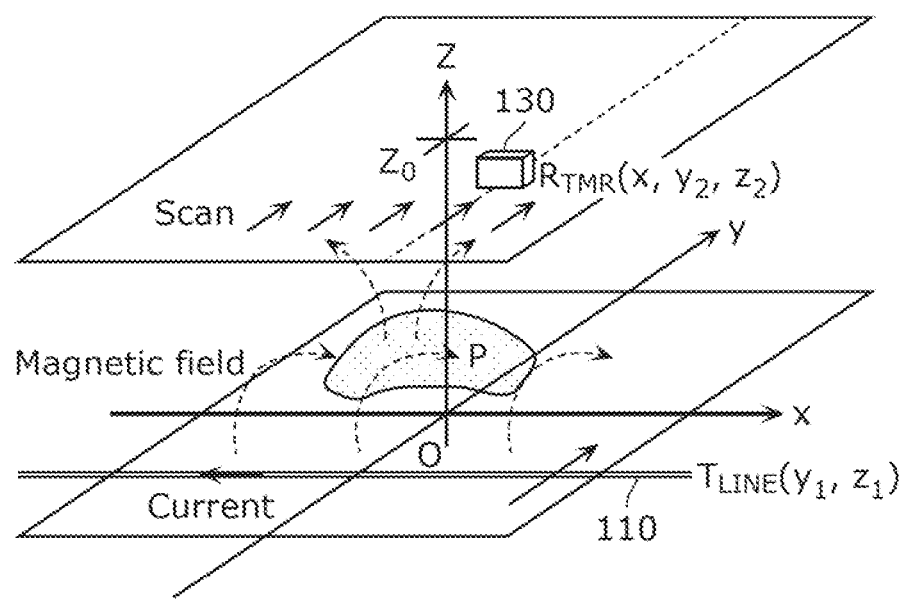
FIG. 3 is a schematic diagram illustrating the induction position and the sensing position according to an embodiment of the present disclosure.

FIG. 3 is a schematic diagram illustrating the induction position and the sensing position according to the present embodiment. In the example illustrated in FIG. 3, the induction position and the sensing position in the xyz Cartesian coordinate system are represented.

More specifically, induction circuit 110 is a conductive line that carries current parallel to the x-axis. The position of induction circuit 110 is therefore expressed as $T_{LINE}(y_1, z_1)$. Stated differently, the induction position is expressed as $T_{LINE}(y_1, z_1)$. Since magnetic sensor 130 can have an x-coordinate, a y-coordinate and a z-coordinate, the position of magnetic sensor 130 is expressed as $R_{TMR}(x, y_2, z_2)$. Stated differently, the sensing position is expressed as $R_{TMR}(x, y_2, z_2)$.

In the example in FIG. 3, the position of the sample is represented by P. The sample can also be described as an induction magnetic source. The magnetic field component is transferred in the following order: $T_{LINE}(y_1, z_1) \rightarrow P \rightarrow R_{TMR}(x, y_2, z_2)$.

For induction position $T_{LINE}(y_1, z_1)$ and sensing position $R_{TMR}(x, y_2, z_2)$, the magnetic strength at sensing position $R_{TMR}(x, y_2, z_2)$ can be expressed as $\Phi(x, y_1, y_2, z_1, z_2)$. $\Phi(x, y_1, y_2, z_1, z_2)$ is an induction position dependent magnetic field function that takes induction position $T_{LINE}(y_1, z_1)$ and sensing position $R_{TMR}(x, y_2, z_2)$ as inputs, and outputs the magnetic strength at sensing position $R_{TMR}(x, y_2, z_2)$.

Induction position $T_{LINE}(y_1, z_1)$ may be a virtual position of induction circuit 110. Sensing position $R_{TMR}(x, y_2, z_2)$ may be a virtual position of magnetic sensor 130. If induction position $T_{LINE}(y_1, z_1)$ corresponds to the actual position of induction circuit 110 and sensing position $R_{TMR}(x, y_2, z_2)$ corresponds to the actual position of magnetic sensor 130, $\Phi(x, y_1, y_2, z_1, z_2)$ corresponds to the measurement value, which is the actual sensing result.

In the example illustrated in FIG. 3, induction circuit 110 is positioned at z=0 and scans in the y-axis direction. Magnetic sensor 130 is positioned at z=$z_0$ and scans in the x- and y-axis directions in the xy plane. This yields $\Phi(x, y_1, y_2, z_1=0, z_2=z_0)$ as the measurement value for each combination of x, $y_1$ and $y_2$. This measurement value is used as a boundary condition for the induction position dependent magnetic field function, which is $\Phi(x, y_1, y_2, z_1, z_2)$.

$\Phi(x, y_1, y_2, z_1, z_2)$ is a harmonic function related to $y_1$ and $z_1$ corresponding to induction position $T_{LINE}(y_1, z_1)$ and a harmonic function related to x, $y_2$ and $z_2$ corresponding to sensing position $R_{TMR}(x, y_2, z_2)$. Therefore, $\Phi(x, y_1, y_2, z_1, z_2)$ satisfies (2-1) and (2-2) below as fundamental equations, which are Laplace equations related to the multipath problem in a static or quasi-static field.

[Math. 18]
$$\left(\frac{\partial^2}{\partial y_1^2}+\frac{\partial^2}{\partial z_1^2}\right)\Phi(x, y_1, y_2, z_1, z_2) = 0 \quad (2\text{-}1)$$

[Math. 19]
$$\left(\frac{\partial^2}{\partial x^2}+\frac{\partial^2}{\partial y_2^2}+\frac{\partial^2}{\partial z_2^2}\right)\Phi(x, y_1, y_2, z_1, z_2) = 0 \quad (2\text{-}2)$$

When the z-coordinate of position P of the sample is greater than the z-coordinate of induction circuit 110 and less than the z-coordinate of magnetic sensor 130, the general solution of (2-1) and the general solution of (2-2) can each be expressed as either a term that increases exponentially in the z-direction or a term that attenuates exponentially in the z-direction. More specifically, the general solution of (2-1) and the general solution of (2-2) can each be expressed as (2-3) and (2-4) shown below.

[Math. 20]
$$\Phi(x, y_1, y_2, z_1, z_2) = \int_{-\infty}^{\infty} a_1(k_{y_1})e^{ik_{y_1}y_1}e^{k_{y_1}z_1}dk_{y_1} \quad (2\text{-}3)$$

[Math. 21]
$$\Phi(x, y_1, y_2, z_1, z_2) = \int_{-\infty}^{\infty}\int_{-\infty}^{\infty} a_2(k_x, k_{y_2})e^{ik_x x+ik_{y_2}y_2}e^{-\sqrt{k_x^2+k_{y_2}^2}\,z_2}dk_x dk_{y_2} \quad (2\text{-}4)$$

The combination of (2-3) and (2-4) can be expressed as (2-5) shown below.

[Math. 22]
$$\Phi(x, y_1, y_2, z_1, z_2) = \int_{-\infty}^{\infty}\int_{-\infty}^{\infty}\int_{-\infty}^{\infty} a(k_x, k_{y_1}, k_{y_2}) \quad (2\text{-}5)$$
$$e^{ik_x x+ik_{y_1}y_1+ik_{y_2}y_2}e^{k_{y_1}z_1-\sqrt{k_x^2+k_{y_2}^2}\,z_2}dk_x dk_{y_1}dk_{y_2}$$

Applying the measurement values at $z_1=0$ and $z_2=z_0$ as boundary conditions to (2-5) yields (2-6) shown below.

[Math. 23]
$$\Phi(x, y_1, y_2, 0, z_0) = \quad (2\text{-}6)$$
$$\int_{-\infty}^{\infty}\int_{-\infty}^{\infty}\int_{-\infty}^{\infty} a(k_x, k_{y_1}, k_{y_2})e^{ik_x x+ik_{y_1}y_1+ik_{y_2}y_2}e^{-\sqrt{k_x^2+k_{y_2}^2}\,z_0}dk_x dk_{y_1}dk_{y_2}$$

The inverse Fourier transform of (2-6) yields (2-7) shown below.

[Math. 24]
$$a(k_x, k_{y_1}, k_{y_2}) = e^{z_0\sqrt{k_x^2+k_{y_2}^2}}\,\tilde{\Phi}(k_x, k_{y_1}, k_{y_2}, z_1=0, z_2=z_0) \quad (2\text{-}7)$$

The following shows the Fourier transform image of the measurement value:

[Math. 25]
$$\tilde{\Phi}(k_x, k_{y_1}, k_{y_2}, z_1=0, z_2=z_0)$$

The induction position dependent magnetic field function is therefore expressed by (2-8) shown below.

[Math. 26]
$$\Phi(x, y_1, y_2, z_1, z_2) = \int_{-\infty}^{\infty}\int_{-\infty}^{\infty}\int_{-\infty}^{\infty} a(k_x, k_{y_1}, k_{y_2}) \quad (2\text{-}8)$$
$$e^{ik_x x+ik_{y_1}y_1+ik_{y_2}y_2}e^{k_{y_1}z_1-\sqrt{k_x^2+k_{y_2}^2}\,z_2}dk_x dk_{y_1}dk_{y_2},$$
$$a(k_x, k_{y_1}, k_{y_2}) = e^{z_0\sqrt{k_x^2+k_{y_2}^2}}\,\tilde{\Phi}(k_x, k_{y_1}, k_{y_2}, z_1=0, z_2=z_0)$$

By applying $x \to x$, $y_2 \to y_1$ (=y) and $z_2 \to z_2$ (=z) to the induction position dependent magnetic field function, the output is assumed to indicate the magnetic strength sensed at (x, y, z) after the induction of the magnetic field component at (x, y, z). The stronger the magnetism, the higher the magnetic susceptibility is assumed to be, and the image showing this magnetic strength is assumed to show the magnetic susceptibility distribution in an area including the interior of the sample. The imaging function for generating such an image is expressed in (2-9) given below.

[Math. 27]
$$\varphi(x, y, z) = \quad (2\text{-}9)$$
$$\lim_{\substack{y_2 \to y_1 = y \\ z_2 \to z_1 = z}} \Phi(x, y_1, y_2, z_1, z_2) = \lim_{\substack{y_2 \to y_1 = y \\ z_2 \to z_1 = z}} \int_{-\infty}^{\infty}\int_{-\infty}^{\infty}\int_{-\infty}^{\infty} a(k_x, k_{y_1}, k_{y_2})$$
$$e^{ik_x x+ik_{y_1}y_1+ik_{y_2}y_2}e^{k_{y_1}z_1-\sqrt{k_x^2+k_{y_2}^2}\,z_2}dk_x dk_{y_1}dk_{y_2}$$

The imaging function in (2-9) is a function that takes the imaging target position as an input and outputs the image intensity at the imaging target position. The image intensity corresponds to the value output as the magnetic strength from the induction position dependent magnetic field function in response to inputting the imaging target position into the induction position dependent magnetic field function.

For example, information processing circuit 150 of magnetic susceptibility distribution visualization device 100 calculates the induction position dependent magnetic field function based on the sensing result, which is the measurement value, and (2-8). Information processing circuit 150 then calculates an imaging function based on the induction position dependent magnetic field function and (2-9). Information processing circuit 150 then generates, based on the imaging function, an image showing the magnetic susceptibility distribution. More specifically, information processing circuit 150 generates an image consisting of the values output from the imaging function for each imaging target position as an image showing the magnetic susceptibility distribution.

This enables magnetic susceptibility distribution visualization device 100 to generate an image showing the magnetic susceptibility distribution with high accuracy, using the induction position dependent magnetic field function and the imaging function described above.

Note that the equations such as the induction position dependent magnetic field function and the imaging function described above with reference to FIG. 3 are merely examples; the equations such as the induction position dependent magnetic field function and the imaging function are not limited to the above examples. Other equations based on different conditions can be derived by the same kind of method as the above method.

For example, in the example of FIG. 3, magnetic sensor 130 and induction circuit 110 are located on opposite sides of the sample, but magnetic sensor 130 and induction circuit 110 may be located on the same side of the sample. For example, when the z-coordinate of P is less than the z-coordinate of induction circuit 110 and less than the z-coordinate of magnetic sensor 130, (2-3) given above can be replaced by (3-1) given below.

[Math. 28]

$$\Phi(x, y_1, y_2, z_1, z_2) = \int_{-\infty}^{\infty} a_1(k_{y_1}) e^{ik_{y_1} y_1} e^{-k_{y_1} z_1} dk_{y_1} \quad (3-1)$$

In this case, the induction position dependent magnetic field function is therefore expressed by (3-2) shown below.

[Math. 29]

$$\Phi(x, y_1, y_2, z_1, z_2) = \int_{-\infty}^{\infty} \int_{-\infty}^{\infty} \int_{-\infty}^{\infty} a(k_x, k_{y_1}, k_{y_2}) \quad (3-2)$$

$$e^{ik_x x + ik_{y_1} y_1 + ik_{y_2} y_2} e^{-k_{y_1} z_1 - \sqrt{k_x^2 + k_{y_2}^2} \, z_2} dk_x dk_{y_1} dk_{y_2},$$

$$a(k_x, k_{y_1}, k_{y_2}) = e^{z_0 \sqrt{k_x^2 + k_{y_2}^2}} \overline{\Phi}(k_x, k_{y_1}, k_{y_2}, z_1 = 0, z_2 = z_0)$$

Moreover, in this case, the imaging function can be expressed by (3-3) shown below.

[Math. 30]

$$\varphi(x, y, z) = \quad (3-3)$$

$$\lim_{\substack{y_2 \to y_1 = y \\ z_2 \to z_1 = z}} \Phi(x, y_1, y_2, z_1, z_2) = \lim_{\substack{y_2 \to y_1 = y \\ z_2 \to z_1 = z}} \int_{-\infty}^{\infty} \int_{-\infty}^{\infty} \int_{-\infty}^{\infty} a(k_x, k_{y_1}, k_{y_2})$$

$$e^{ik_x x + ik_{y_1} y_1 + ik_{y_2} y_2} e^{-k_{y_1} z_1 - \sqrt{k_x^2 + k_{y_2}^2} \, z_2} dk_x dk_{y_1} dk_{y_2}$$

Figure 4:
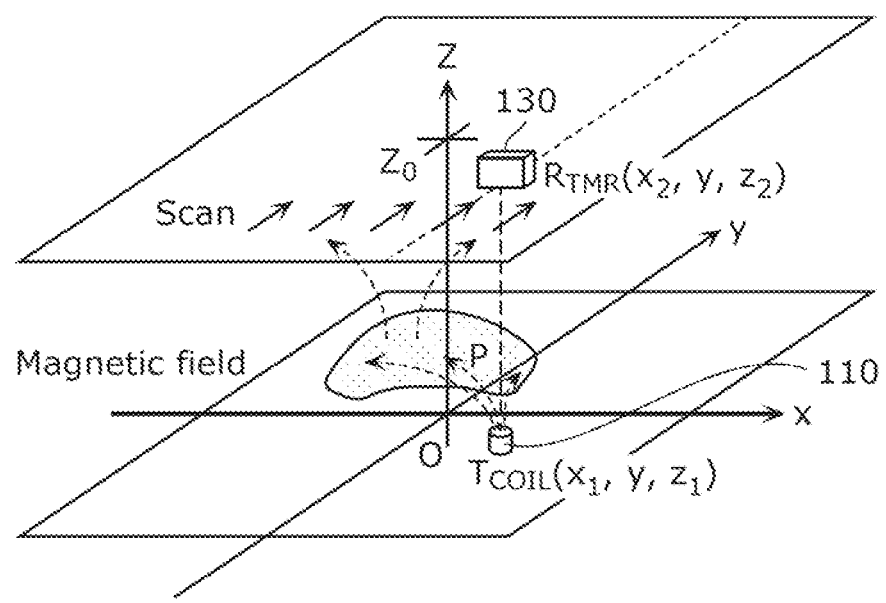
FIG. 4 is a schematic diagram illustrating another example of the induction position and the sensing position according to an embodiment of the present disclosure.

FIG. 4 is a schematic diagram illustrating another example of the induction position and the sensing position according to the present embodiment. Just like the example illustrated in FIG. 3, in the example illustrated in FIG. 4, the induction position and the sensing position in the xyz Cartesian coordinate system are represented. In the example of FIG. 4, induction circuit 110 is a coil. Induction circuit 110 and magnetic sensor 130 are located at the same y-coordinate, and the y-coordinate of induction circuit 110 and the y-coordinate of magnetic sensor 130 change as one.

The position of induction circuit 110 is therefore expressed as $T_{COIL}(x_1, y, z_1)$. Stated differently, the induction position is expressed as $T_{COIL}(x_1, y, z_1)$. The position of magnetic sensor 130 is expressed as $R_{TMR}(x_2, y, z_2)$. Stated differently, the sensing position is expressed as $R_{TMR}(x_2, y, z_2)$. $x_1$ and $x_2$ are independent of each other, and $z_1$ and $z_2$ are independent of each other.

Just like the example in FIG. 3, in the example in FIG. 4, the position of the sample is represented by P. The magnetic field component is transferred in the following order: $T_{COIL}(x_1, y, z_1) \to P \to R_{TMR}(x_2, y, z_2)$.

For induction position $T_{COIL}(x_1, y, z_1)$ and sensing position $R_{TMR}(x_2, y, z_2)$, the magnetic strength at sensing position $R_{TMR}(x_2, y, z_2)$ can be expressed as $\Phi(x_1, x_2, y, z_1, z_2)$. $\Phi(x_1, x_2, y, z_1, z_2)$ is an induction position dependent magnetic field function that takes induction position $T_{COIL}(x_1, y, z_1)$ and sensing position $R_{TMR}(x_2, y, z_2)$ as inputs, and outputs the magnetic strength at sensing position $R_{TMR}(x_2, y, z_2)$.

Induction position $T_{COIL}(x_1, y, z_1)$ may be a virtual position of induction circuit 110. Sensing position $R_{TMR}(x_2, y, z_2)$ may be a virtual position of magnetic sensor 130. If induction position $T_{COIL}(x_1, y, z_1)$ corresponds to the actual position of induction circuit 110 and sensing position $R_{TMR}(x_2, y, z_2)$ corresponds to the actual position of magnetic sensor 130, $\Phi(x_1, x_2, y, z_1, z_2)$ corresponds to the measurement value, which is the actual sensing result.

In the example illustrated in FIG. 4, induction circuit 110 is positioned at z=0 and scans in the y- and x-axis directions in the xy plane. Magnetic sensor 130 is positioned at $z=z_0$ and scans in the x- and y-axis directions in the xy plane. This yields $\Phi(x_1, x_2, y, z_1=0, z_2=z_0)$ as the measurement value for each combination of $x_1$, $x_2$, and y. This measurement value is used as a boundary condition for the induction position dependent magnetic field function, which is $\Phi(x_1, x_2, y, z_1, z_2)$.

$\Phi(x_1, x_2, y, z_1, z_2)$ is a harmonic function related to $x_1$, y, and $z_1$ corresponding to induction position $T_{COIL}(x_1, y, z_1)$ and a harmonic function related to $x_2$, y and $z_2$ corresponding to sensing position $R_{TMR}(x_2, y, z_2)$. Therefore, $\Phi(x_1, x_2, y, z_1, z_2)$ satisfies (4-1) and (4-2) below as fundamental equations, which are Laplace equations related to the multipath problem in a static or quasi-static field.

[Math. 31]

$$\left(\frac{\partial^2}{\partial x_1^2} + \frac{\partial^2}{\partial y^2} + \frac{\partial^2}{\partial z_1^2}\right)\Phi(x_1, x_2, y, z_1, z_2) = 0 \quad (4-1)$$

[Math. 32]

$$\left(\frac{\partial^2}{\partial x_2^2} + \frac{\partial^2}{\partial y^2} + \frac{\partial^2}{\partial z_2^2}\right)\Phi(x_1, x_2, y, z_1, z_2) = 0 \quad (4-2)$$

When the z-coordinate of position P of the sample is greater than the z-coordinate of induction circuit 110 and less than the z-coordinate of magnetic sensor 130, the general solution of (4-1) and the general solution of (4-2) can each be expressed as either a term that increases exponentially in the z-direction or a term that attenuates exponentially in the z-direction. More specifically, the general solution of (4-1) and the general solution of (4-2) can each be expressed as (4-3) and (4-4) shown below.

[Math. 33]

$$\Phi(x_1, x_2, y, z_1, z_2) = \int_{-\infty}^{\infty}\int_{-\infty}^{\infty} a_1(k_{x_1}, k_y) e^{ik_{x_1}x_1 + ik_y y} e^{\sqrt{k_{x_1}^2 + k_y^2}\, z_1} dk_{x_1} dk_y \quad (4\text{-}3)$$

[Math. 34]

$$\Phi(x_1, x_2, y, z_1, z_2) = \int_{-\infty}^{\infty}\int_{-\infty}^{\infty} a_2(k_{x_2}, k_y) e^{ik_{x_2}x_2 + ik_y y} e^{-\sqrt{k_{x_2}^2 + k_y^2}\, z_2} dk_{x_2} dk_y \quad (4\text{-}4)$$

The combination of (4-3) and (4-4) can be expressed as (4-5) shown below.

[Math. 35]

$$\Phi(x_1, x_2, y, z_1, z_2) = \int_{-\infty}^{\infty}\int_{-\infty}^{\infty}\int_{-\infty}^{\infty} a(k_{x_1}, k_{x_2}, k_y) \quad (4\text{-}5)$$
$$e^{ik_{x_1}x_1 + ik_{x_2}x_2 + ik_y y} e^{\sqrt{k_{x_1}^2 + k_y^2}\, z_1 - \sqrt{k_{x_2}^2 + k_y^2}\, z_2} dk_{x_1} dk_{x_2} dk_y$$

Applying the measurement values at $z_1=0$ and $z_2=z_0$ as boundary conditions to (4-5) yields (4-6) shown below.

[Math. 36]

$$\Phi(x_1, x_2, y, 0, z_0) = \quad (4\text{-}6)$$
$$\int_{-\infty}^{\infty}\int_{-\infty}^{\infty}\int_{-\infty}^{\infty} a(k_{x_1}, k_{x_2}, k_y) e^{ik_{x_1}x_1 + ik_{x_2}x_2 + ik_y y} e^{-\sqrt{k_{x_2}^2 + k_y^2}\, z_0} dk_{x_1} dk_{x_2} dk_y$$

The inverse Fourier transform of (4-6) yields (4-7) shown below.

[Math. 37]

$$a(k_{x_1}, k_{x_2}, k_y) = e^{z_0\sqrt{k_{x_2}^2 + k_y^2}}\, \overline{\Phi}(k_{x_1}, k_{x_2}, k_y, z_1 = 0, z_2 = z_0) \quad (4\text{-}7)$$

The following shows the Fourier transform image of the measurement value:

$$\overline{\Phi}(k_{x_1}, k_{x_2}, k_y, z_1=0, z_2=z_0) \qquad [\text{Math. 38}]$$

The induction position dependent magnetic field function is therefore expressed by (4-8) shown below.

[Math. 39]

$$\Phi(x_1, x_2, y, z_1, z_2) = \int_{-\infty}^{\infty}\int_{-\infty}^{\infty}\int_{-\infty}^{\infty} a(k_{x_1}, k_{x_2}, k_y) \quad (4\text{-}8)$$
$$e^{ik_{x_1}x_1 + ik_{x_2}x_2 + ik_y y} e^{\sqrt{k_{x_1}^2 + k_y^2}\, z_1 - \sqrt{k_{x_2}^2 + k_y^2}\, z_2} dk_{x_1} dk_{x_2} dk_y$$
$$a(k_{x_1}, k_{x_2}, k_y) = e^{z_0 \sqrt{k_{x_2}^2 + k_y^2}}\, \overline{\Phi}(k_{x_1}, k_{x_2}, k_y, z_1 = 0, z_2 = z_0)$$

By applying $x_2 \to x_1$ (=x), $y \to y$, and $z_2 \to z_1$ (=z) to the induction position dependent magnetic field function, the output is assumed to indicate the magnetic strength sensed at (x, y, z) after the induction of the magnetic field component at (x, y, z). The stronger the magnetism, the higher the magnetic susceptibility is assumed to be, and the image showing this magnetic strength is assumed to show the magnetic susceptibility distribution in an area including the interior of the sample. The imaging function for generating such an image is expressed in (4-9) given below.

[Math. 40]

$$\varphi(x, y, z) = \quad (4\text{-}9)$$
$$\lim_{\substack{x_2 \to x_1 = x \\ z_2 \to z_1 = z}} \Phi(x_1, x_2, y, z_1, z_2) = \lim_{\substack{x_2 \to x_1 = x \\ z_2 \to z_1 = z}} \int_{-\infty}^{\infty}\int_{-\infty}^{\infty}\int_{-\infty}^{\infty} a(k_{x_1}, k_{x_2}, k_y)$$
$$e^{ik_{x_1}x_1 + ik_{x_2}x_2 + ik_y y} e^{\sqrt{k_{x_1}^2 + k_y^2}\, z_1 - \sqrt{k_{x_2}^2 + k_y^2}\, z_2} dk_{x_1} dk_{x_2} dk_y$$

The imaging function in (4-9) is a function that takes the imaging target position as an input and outputs the image intensity at the imaging target position. The image intensity corresponds to the value output as the magnetic strength from the induction position dependent magnetic field function in response to inputting the imaging target position into the induction position dependent magnetic field function.

For example, information processing circuit 150 of magnetic susceptibility distribution visualization device 100 calculates the induction position dependent magnetic field function based on the sensing result, which is the measurement value, and (4-8). Information processing circuit 150 then calculates an imaging function based on the induction position dependent magnetic field function and (4-9). Information processing circuit 150 then generates, based on the imaging function, an image showing the magnetic susceptibility distribution. More specifically, information processing circuit 150 generates an image consisting of the values output from the imaging function for each imaging target position as an image showing the magnetic susceptibility distribution.

This enables magnetic susceptibility distribution visualization device 100 to generate an image showing the magnetic susceptibility distribution with high accuracy, using the induction position dependent magnetic field function and the imaging function described above.

Figure 5:
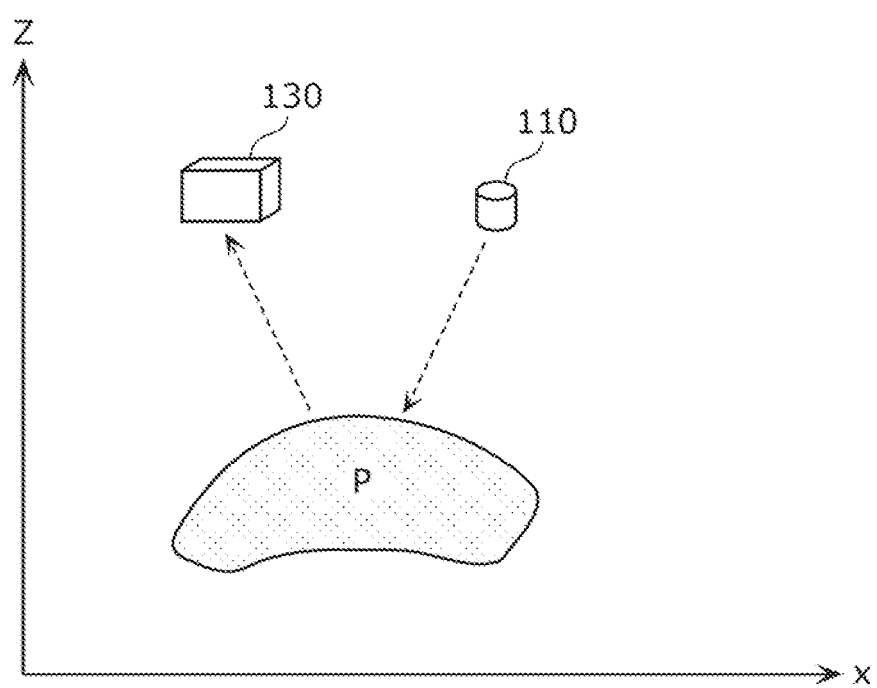
FIG. 5 is a schematic diagram illustrating yet another example of the induction position and the sensing position according to an embodiment of the present disclosure.

FIG. 5 is a schematic diagram illustrating yet another example of the induction position and the sensing position according to the present embodiment. In the example of FIG. 4 described above, magnetic sensor 130 and induction circuit 110 are located on opposite sides of the sample. In contrast, in the example of FIG. 5, magnetic sensor 130 and induction circuit 110 are located on the same side of the sample. The other conditions in the example of FIG. 5 are the same as in the example in FIG. 4.

As in the example of FIG. 5, when the z-coordinate of P is less than the z-coordinate of induction circuit 110 and less than the z-coordinate of magnetic sensor 130, (4-3) given above can be replaced by (5-1) given below.

[Math. 41]

$$\Phi(x_1, x_2, y, z_1, z_2) = \int_{-\infty}^{\infty}\int_{-\infty}^{\infty} a_1(k_{x_1}, k_y) e^{ik_{x_1}x_1 + ik_y y} e^{-\sqrt{k_{x_1}^2 + k_y^2}\, z_1} dk_{x_1} dk_y \quad (5\text{-}1)$$

In this case, the induction position dependent magnetic field function is therefore expressed by (5-2) shown below.

[Math. 42]

$$\Phi(x_1, x_2, y, z_1, z_2) = \int_{-\infty}^{\infty} \int_{-\infty}^{\infty} \int_{-\infty}^{\infty} a(k_{x_1}, k_{x_2}, k_y) \quad (5\text{-}2)$$

$$e^{ik_{x_1}x_1 + ik_{x_2}x_2 + ik_y y} e^{-\sqrt{k_{x_1}^2 + k_y^2} z_1 - \sqrt{k_{x_2}^2 + k_y^2} z_2} dk_{x_1} dk_{x_2} dk_y$$

$$a(k_{x_1}, k_{x_2}, k_y) = e^{z_0 \sqrt{k_{x_2}^2 + k_y^2}} \overline{\Phi}(k_{x_1}, k_{x_2}, k_y, z_1 = 0, z_2 = z_0)$$

Moreover, in this case, the imaging function can be expressed by (5-3) shown below.

[Math. 43]

$$\varphi(x, y, z) = \quad (5\text{-}3)$$

$$\lim_{\substack{x_2 \to x_1 = x \\ z_2 \to z_1 = z}} \Phi(x_1, x_2, y, z_1, z_2) = \lim_{\substack{x_2 \to x_1 = x \\ z_2 \to z_1 = z}} \int_{-\infty}^{\infty} \int_{-\infty}^{\infty} \int_{-\infty}^{\infty} a(k_{x_1}, k_{x_2}, k_y)$$

$$e^{ik_{x_1}x_1 + ik_{x_2}x_2 + ik_y y} e^{-\sqrt{k_{x_1}^2 + k_y^2} z_1 - \sqrt{k_{x_2}^2 + k_y^2} z_2} dk_{x_1} dk_{x_2} dk_y$$

Figure 6:
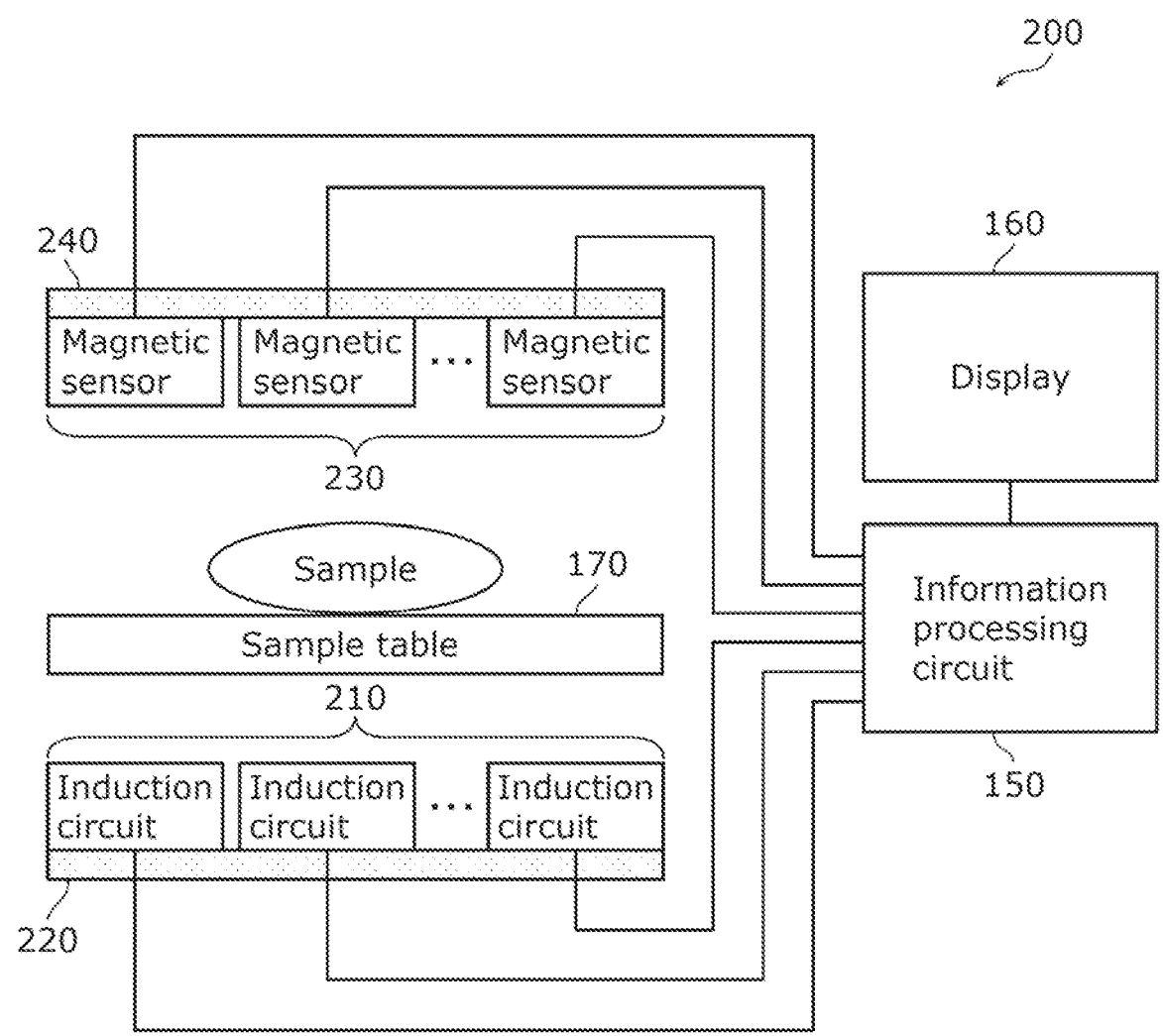
FIG. 6 is a configuration diagram of a second example of a magnetic susceptibility distribution visualization device according to an embodiment of the present disclosure.

FIG. 6 is a configuration diagram of a second example of a magnetic susceptibility distribution visualization device according to the present embodiment. Magnetic susceptibility distribution visualization device 200 illustrated in FIG. 6 includes a plurality of induction circuits 210, induction circuit support structure 220, a plurality of magnetic sensors 230, magnetic sensor support structure 240, information processing circuit 150, display 160, and sample table 170. Magnetic susceptibility distribution visualization device 200 generates an image showing the magnetic susceptibility distribution of an area including the interior of the sample placed on sample table 170.

The plurality of induction circuits 210 are the same type of electrical circuit as induction circuit 110 illustrated in FIG. 1. In the example of FIG. 6, a plurality of induction circuits 210 are used instead of one induction circuit 110. The plurality of induction circuits 210 sequentially induce the first magnetic field component without moving. Stated differently, the plurality of induction circuits 210 induce the first magnetic field component one by one or every predetermined unit. With this, just like induction circuit 110, the plurality of induction circuits 210 can induce the first magnetic field component from each of the induction positions.

Induction circuit support structure 220 is a structure that fixedly supports the plurality of induction circuits 210. In the example of FIG. 6, induction circuit actuator 120 illustrated in FIG. 1 is not necessary because the plurality of induction circuits 210 do not move.

The plurality of magnetic sensors 230 are the same type of sensor as magnetic sensor 130 illustrated in FIG. 1. In the example of FIG. 6, a plurality of magnetic sensors 230 are used instead of one magnetic sensor 130. The plurality of magnetic sensors 230 can sense magnetism at sensing positions without moving. In other words, just like magnetic sensor 130, the plurality of magnetic sensors 230 can sense magnetism at each of the sensing positions.

Magnetic sensor support structure 240 is a structure that fixedly supports the plurality of magnetic sensors 230. In the example of FIG. 6, magnetic sensor actuator 140 illustrated in FIG. 1 is not necessary because the plurality of magnetic sensors 230 do not move.

The plurality of induction circuits 210 and the plurality of magnetic sensors 230, etc., of magnetic susceptibility distribution visualization device 200 illustrated in FIG. 6 can fulfill the same role as induction circuit 110 and magnetic sensor 130, etc., of magnetic susceptibility distribution visualization device 100 illustrated in FIG. 1. Accordingly, just like magnetic susceptibility distribution visualization device 100, magnetic susceptibility distribution visualization device 200 can also sense the magnetism affected by the sample while changing the relative positional relationship between the sample, the induction position, and the sensing position.

This enables magnetic susceptibility distribution visualization device 200 to obtain sufficient information on the magnetic susceptibility distribution of an area including the interior of the sample. Magnetic susceptibility distribution visualization device 200 can then calculate the induction position dependent magnetic field function based on the obtained sufficient information, and can generate an image showing the magnetic susceptibility distribution with high accuracy based on the calculated induction position dependent magnetic field function.

The example in FIG. 1 may be combined with the example in FIG. 2. For example, a moving induction circuit 110 and a plurality of magnetic sensors 230 may be used, or a plurality of induction circuits 210 and a moving magnetic sensor 130 may be used.

Figure 7:
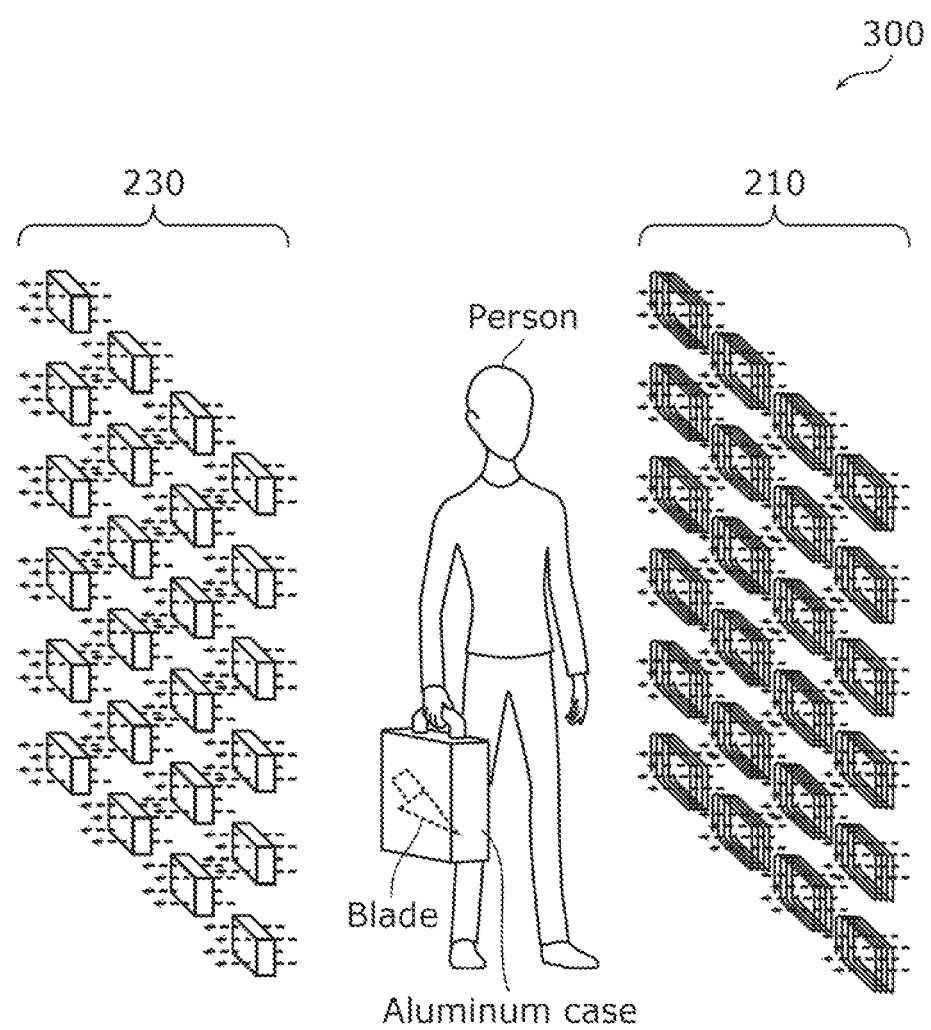
FIG. 7 is a schematic diagram illustrating a first example of a body scanner according to an embodiment of the present disclosure.

FIG. 7 is a schematic diagram illustrating a first example of a body scanner using magnetic susceptibility distribution visualization device 200 illustrated in FIG. 6.

Body scanner 300 illustrated in FIG. 7 includes a plurality of induction circuits 210 and a plurality of magnetic sensors 230. For example, body scanner 300 also includes information processing circuitry 150 and display 160 illustrated in FIG. 6. Stated differently, body scanner 300 may be magnetic susceptibility distribution visualization device 200 or include magnetic susceptibility distribution visualization device 200. Body scanner 300 then generates an image showing the magnetic susceptibility distribution.

Since blades contain iron, the magnetic susceptibility of blades is high. In contrast, the magnetic susceptibility of the aluminum case is low. It is therefore assumed that blades will appear in the image showing the magnetic susceptibility distribution. Stated differently, body scanner 300 can generate an image of a blade that a person has inside an aluminum case by generating an image showing the magnetic susceptibility distribution.

FIG. 7 is a schematic diagram. The number and size of the plurality of induction circuits 210 and the number and size of the plurality of magnetic sensors 230 may be different from the example in FIG. 7. A larger number of smaller induction circuits 210 may be arranged in a higher density, and a larger number of smaller magnetic sensors 230 may be arranged in a higher density. The same applies to other schematic diagrams as well.

In FIG. 7, for example, a plurality of induction circuits 210 induce the first magnetic field component, one row at a time in the vertical or horizontal direction. The first magnetic field component causes the blade to induce the second magnetic field component. The plurality of magnetic sensors 230 then sense the magnetism of the magnetic field including the second magnetic field component. With this, the plurality of magnetic sensors 230 can sense magnetism at sensing positions for each of the induction positions. Body scanner 300 can then generate an image of the blade with high accuracy based on the sensing result.

More specifically, one vertical or horizontal row of the plurality of induction circuits 210 fulfills the same role as the conductive line shown as induction circuit 110 in FIG. 3. It is assumed that the fundamental equations shown in (2-1) and (2-2) and the like are valid. Therefore, the induction position dependent magnetic field function and the imaging function shown in (2-8) and (2-9) can be derived using the method described with reference to FIG. 3.

Body scanner 300 can therefore generate an image of the blade with high accuracy based on the induction position dependent magnetic field function and the imaging function shown in (2-8) and (2-9). In particular, the aluminum case is impervious to terahertz waves and microwaves. Body scanner 300 can generate an image of the blade inside such an aluminum case with high accuracy.

The plurality of induction circuits 210 need not induce the first magnetic field component one row at a time in the vertical or horizontal direction, and may induce the first magnetic field component one by one or every predetermined unit. In such cases, an induction position dependent magnetic field function and an imaging function different from those shown in (2-8) and (2-9) can be derived using the method described with reference to FIG. 3. Body scanner 300 may generate an image of the blade based on such an induction position dependent magnetic field function and such an imaging function.

Figure 8:
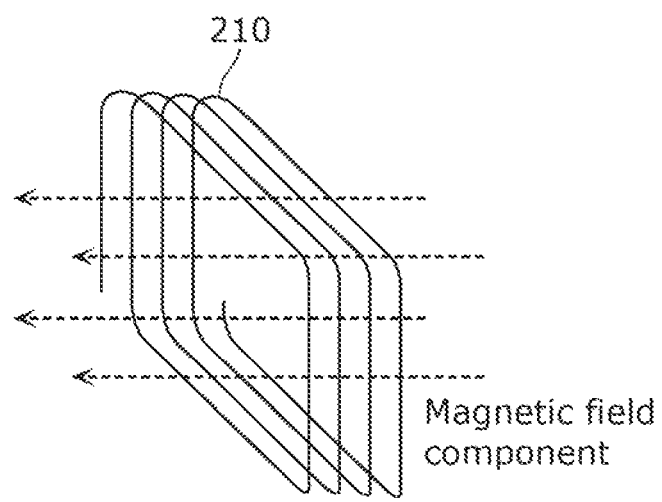
FIG. 8 is a schematic diagram illustrating an induction circuit according to an embodiment of the present disclosure.

FIG. 8 is a schematic diagram of induction circuit 210. Induction circuit 210 illustrated in FIG. 8 corresponds to any one of the plurality of induction circuits 210 illustrated in FIG. 7. More specifically, induction circuit 210 is a coil. This induces the first magnetic field component. Note that induction circuit 210 is not limited to a coil and may be some other electrical circuit.

Figure 9:
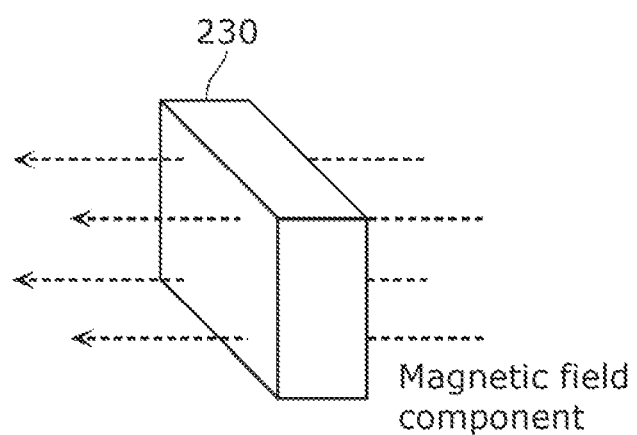
FIG. 9 is a schematic diagram illustrating a magnetic sensor according to an embodiment of the present disclosure.

FIG. 9 is a schematic diagram illustrating magnetic sensor 230. Magnetic sensor 230 illustrated in FIG. 9 corresponds to any one of the plurality of magnetic sensors 230 illustrated in FIG. 7. More specifically, magnetic sensor 230 includes a TMR element or MI element. This enables the magnetism in a magnetic field including the second magnetic field component to be sensed.

Figure 10:
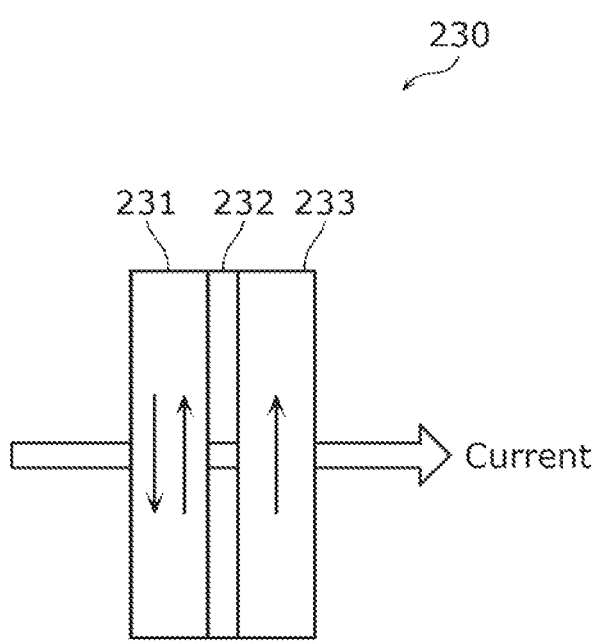
FIG. 10 is a schematic diagram illustrating the specific structure of a magnetic sensor according to an embodiment of the present disclosure.

FIG. 10 is a schematic diagram illustrating the specific structure of magnetic sensor 230 illustrated in FIG. 9. As mentioned above, magnetic sensor 230 includes, for example, a TMR element.

In a TMR element, an insulating film is sandwiched between magnetic films having a thickness of 10 nm to 100 nm. More specifically, the TMR element includes a plurality of thin films including soft layer 231, tunnel layer 232, and PIN layer (magnetization fixing layer) 233. Soft layer 231 is a magnetic film whose direction of magnetization changes according to the direction of magnetization of the external field. PIN layer 233 is a magnetic film whose direction of magnetization does not change. Tunnel layer 232 is an insulating film.

The electrical resistance when the direction of magnetization in soft layer 231 and in PIN layer 233 are the same differs from the electrical resistance when those directions are different. This change in electrical resistance is used to sense the magnetic field component.

For example, magnetic sensor 230 uses the above characteristics to sense and measure magnetic field components. Note that magnetic sensor 230 is not limited to the above example of a TMR element, and may also include of other elements such as a GMR element, a SQUID element, or an MI element.

Figure 11:
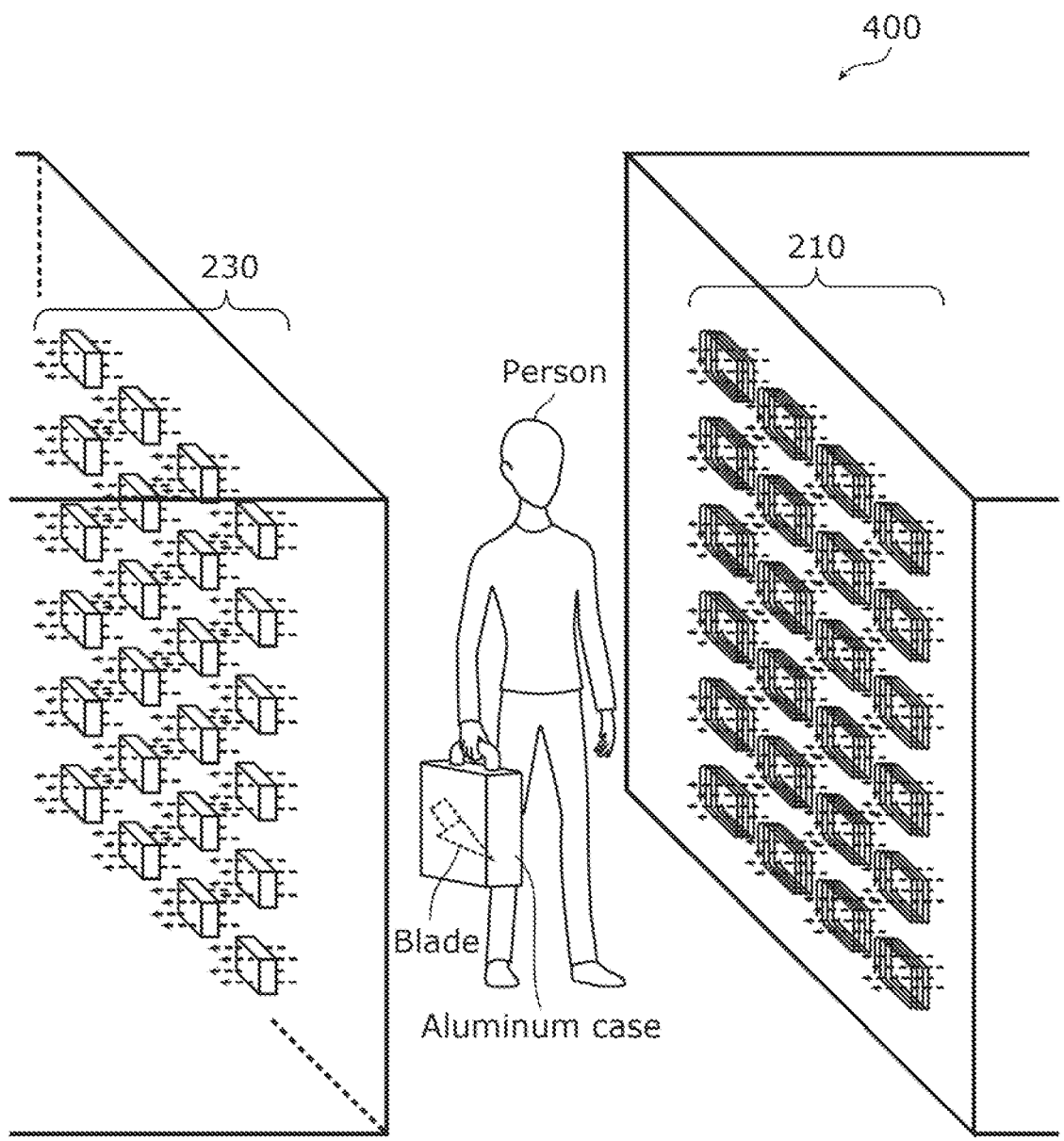
FIG. 11 is a schematic diagram illustrating a second example of a body scanner according to an embodiment of the present disclosure.

FIG. 11 is a schematic diagram illustrating a second example of a body scanner using magnetic susceptibility distribution visualization device 200 illustrated in FIG. 6. Body scanner 400 illustrated in FIG. 11 is essentially the same as body scanner 300 illustrated in FIG. 7, but the plurality of induction circuits 210 and the plurality of magnetic sensors 230 of body scanner 400 are included in a structure. More specifically, the plurality of induction circuits 210 and the plurality of magnetic sensors 230 are included in two walls.

Even more specifically, the plurality of induction circuits 210 are included in a first of two walls and the plurality of magnetic sensors 230 are included in a second of the two walls. While a person is between the two walls, the first magnetic field component is induced from each of the induction positions by the plurality of induction circuits 210, and magnetism is sensed at the sensing positions by the plurality of magnetic sensors 230. This enables body scanner 400 to generate an image of the blade that the person has inside the aluminum case without the person noticing.

Figure 12:
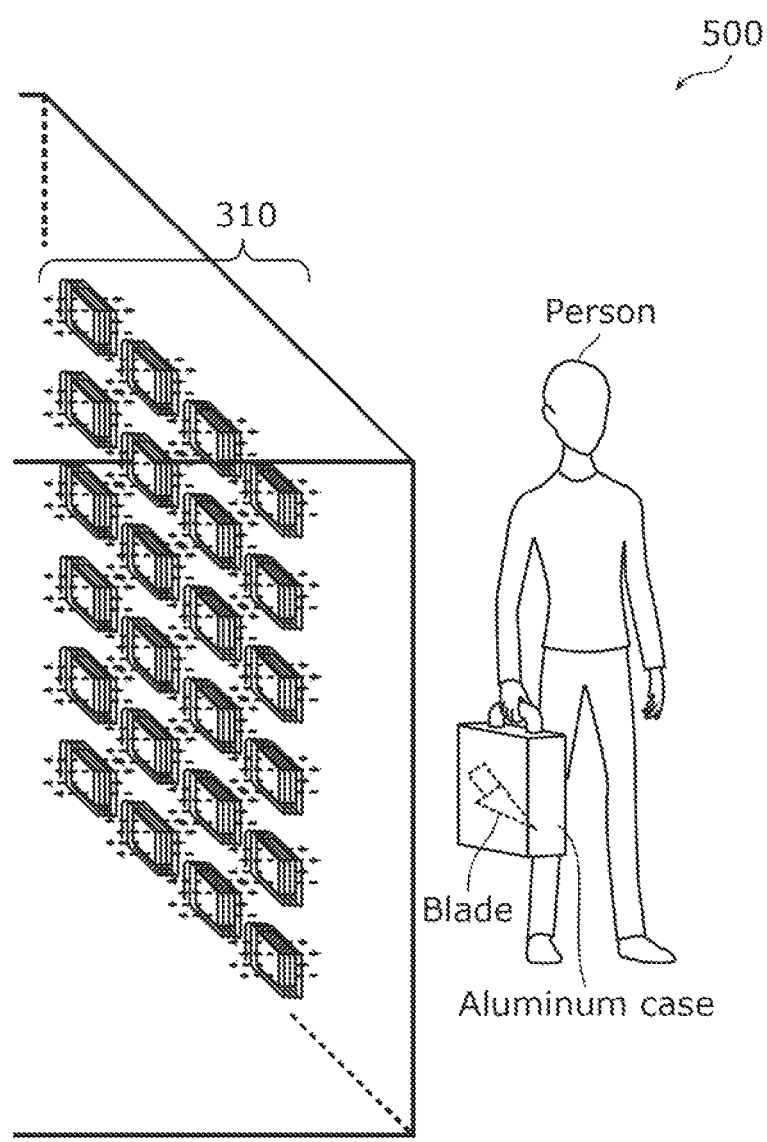
FIG. 12 is a schematic diagram illustrating a third example of a body scanner according to an embodiment of the present disclosure.

FIG. 12 is a schematic diagram illustrating a third example of a body scanner using magnetic susceptibility distribution visualization device 200 illustrated in FIG. 6. Body scanner 500 illustrated in FIG. 12 is essentially the same as body scanner 400 illustrated in FIG. 11, but body scanner 500 includes a plurality of combined circuits 310 of combinations of the plurality of induction circuits 210 and the plurality of magnetic sensors 230. More specifically, one combined circuit 310 includes one induction circuit 210 and one magnetic sensor 230. The plurality of combined circuits 310 are included in a single wall.

In other words, the plurality of magnetic sensors 230 and the plurality of induction circuits 210 are disposed on the same side of the person corresponding to the sample. Thus, for example, the induction position dependent magnetic field function and the imaging function shown in (3-2) and (3-3) can be applied. Body scanner 500 can then generate an image of the blade with high accuracy.

If one vertical or horizontal row of the plurality of combined circuits 310 induces the first magnetic field component, the other rows excluding that one row may sense the magnetism. This prevents a combined circuit 310 from sensing too strong a magnetism due to the first magnetic field component induced by itself.

Figure 13:
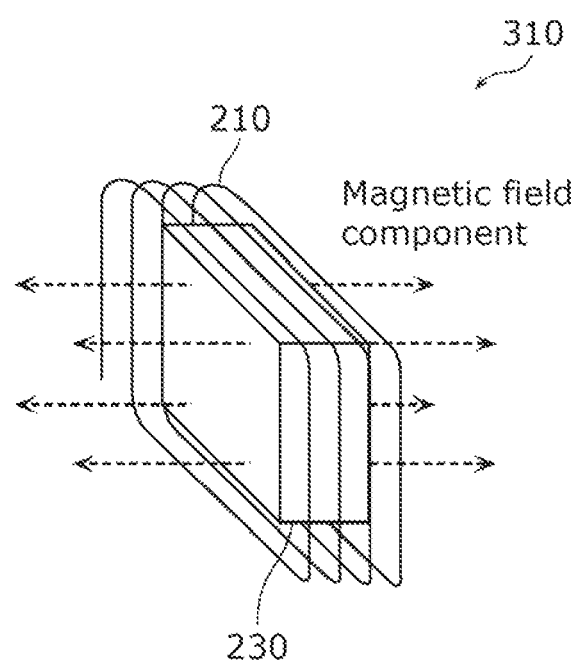
FIG. 13 is a schematic diagram illustrating a combined circuit of a magnetic sensor and an induction circuit according to an embodiment of the present disclosure.

FIG. 13 is a schematic diagram of combined circuit 310. As illustrated in FIG. 13, combined circuit 310 includes induction circuit 210 and magnetic sensor 230. More specifically, induction circuit 210 is a coil. Magnetic sensor 230 includes a TMR element and is provided inside the coil. This enables combined circuit 310 to induce the first magnetic field component and to sense the magnetism in the magnetic field including the second magnetic field component.

Figure 14:
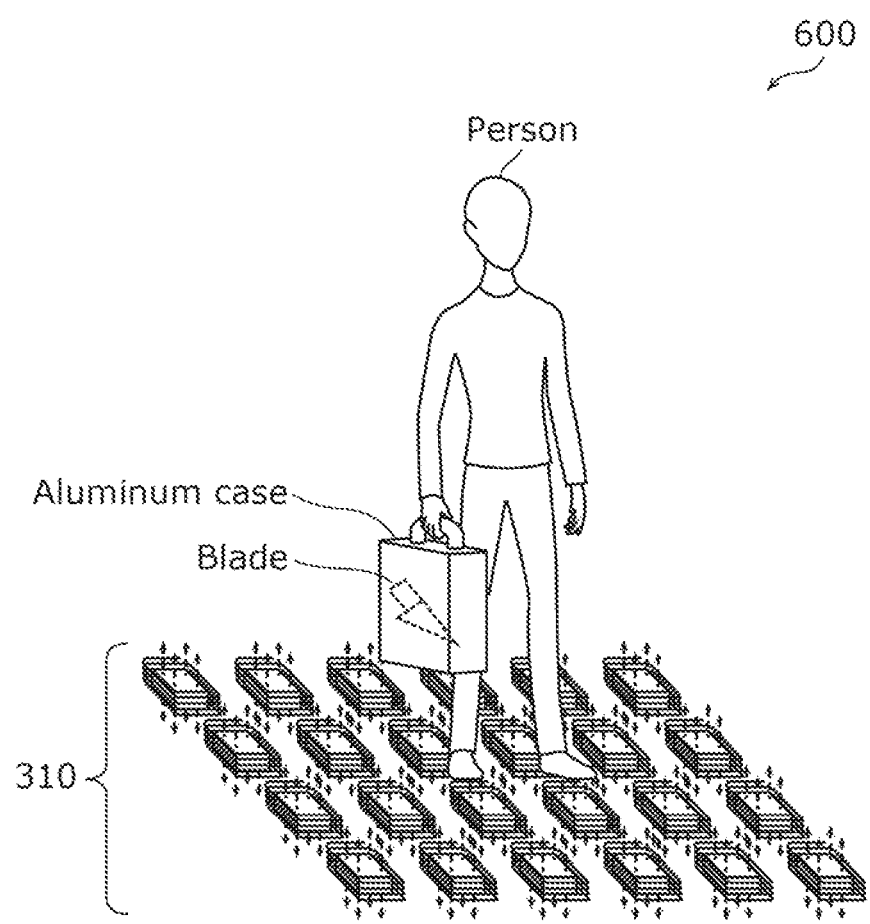
FIG. 14 is a schematic diagram illustrating a fourth example of a body scanner according to an embodiment of the present disclosure.

FIG. 14 is a schematic diagram illustrating a fourth example of a body scanner using magnetic susceptibility distribution visualization device 200 illustrated in FIG. 6. Body scanner 600 illustrated in FIG. 14 is essentially the same as body scanner 500 illustrated in FIG. 12, but the plurality of combined circuits 310 of body scanner 600 are included in the floor.

Just like in the example of FIG. 12, the plurality of magnetic sensors 230 and the plurality of induction circuits 210 are disposed on the same side of the person corresponding to the sample. Thus, for example, the induction position dependent magnetic field function and the imaging function shown in (3-2) and (3-3) can be applied. Body scanner 600 can then generate an image of the blade with high accuracy.

Figure 15:
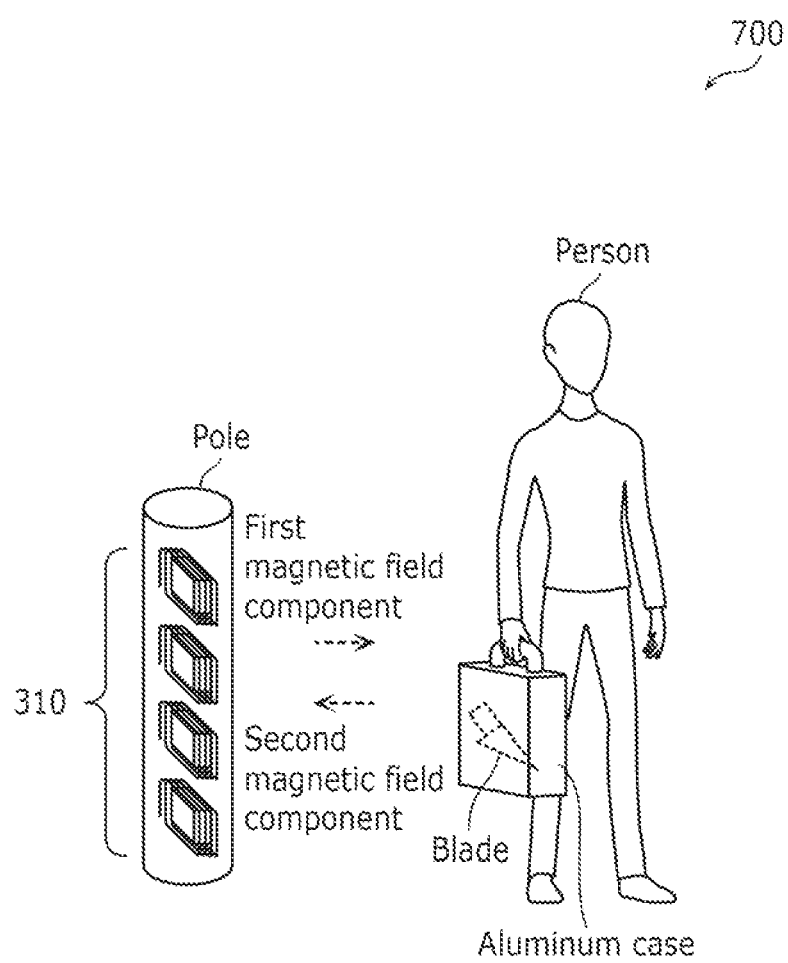
FIG. 15 is a schematic diagram illustrating a fifth example of a body scanner according to an embodiment of the present disclosure.

FIG. 15 is a schematic diagram illustrating a fifth example of a body scanner using magnetic susceptibility distribution visualization device 200 illustrated in FIG. 6. Body scanner 700 illustrated in FIG. 15 is essentially the same as body scanner 500 illustrated in FIG. 12, but the plurality of combined circuits 310 of body scanner 700 are included in a pole. This pole may be the bar or arm of a barrier gate, for example.

In FIG. 15, for example, a person passes by the pole. Here, the plurality of combined circuits 310 included in the pole induce the first magnetic field component one by one. The plurality of combined circuits 310 then sense the magnetism. When sensing the magnetism, a plurality of combined circuits 310 excluding the combined circuit 310 that induces the first magnetic field component may sense the magnetism. Body scanner 700 repeats these processes while the person is passing near the pole.

More specifically, the one-dimensional movement of a person passing near the pole along a direction perpendicular to the pole will cause magnetic sensor 230 of combined circuit 310 included in the pole to perform a one-dimensional scan relative to the person. A two-dimensional image (two-dimensional sensing result) is then obtained by combining the data obtained from a magnetic sensor row of magnetic sensors 230 arranged in one dimension in the pole.

For example, since a person passes near a pole, the plurality of combined circuits 310 can scan in a plane relative to the person. In other words, body scanner 700 can induce the first magnetic field component from each of the induction positions in the plane, and can sense the magnetism of the magnetic field including the second magnetic field component at each of the sensing positions in the plane. Body scanner 700 can then generate an image of, for example, the blade that the person has inside the aluminum case based on the sensing result.

For example, if the direction in which the person is traveling in FIG. 15 is taken as the y-axis direction in FIG. 4, the y-coordinate of induction circuit 210 relative to the traveling person coincides with the y-coordinate of magnetic sensor 230. Moreover, the plurality of magnetic sensors 230 and the plurality of induction circuits 210 are disposed on the same side of the person corresponding to the sample. Thus, for example, the induction position dependent magnetic field function and the imaging function shown in (5-2) and (5-3) can be applied.

Figure 16:
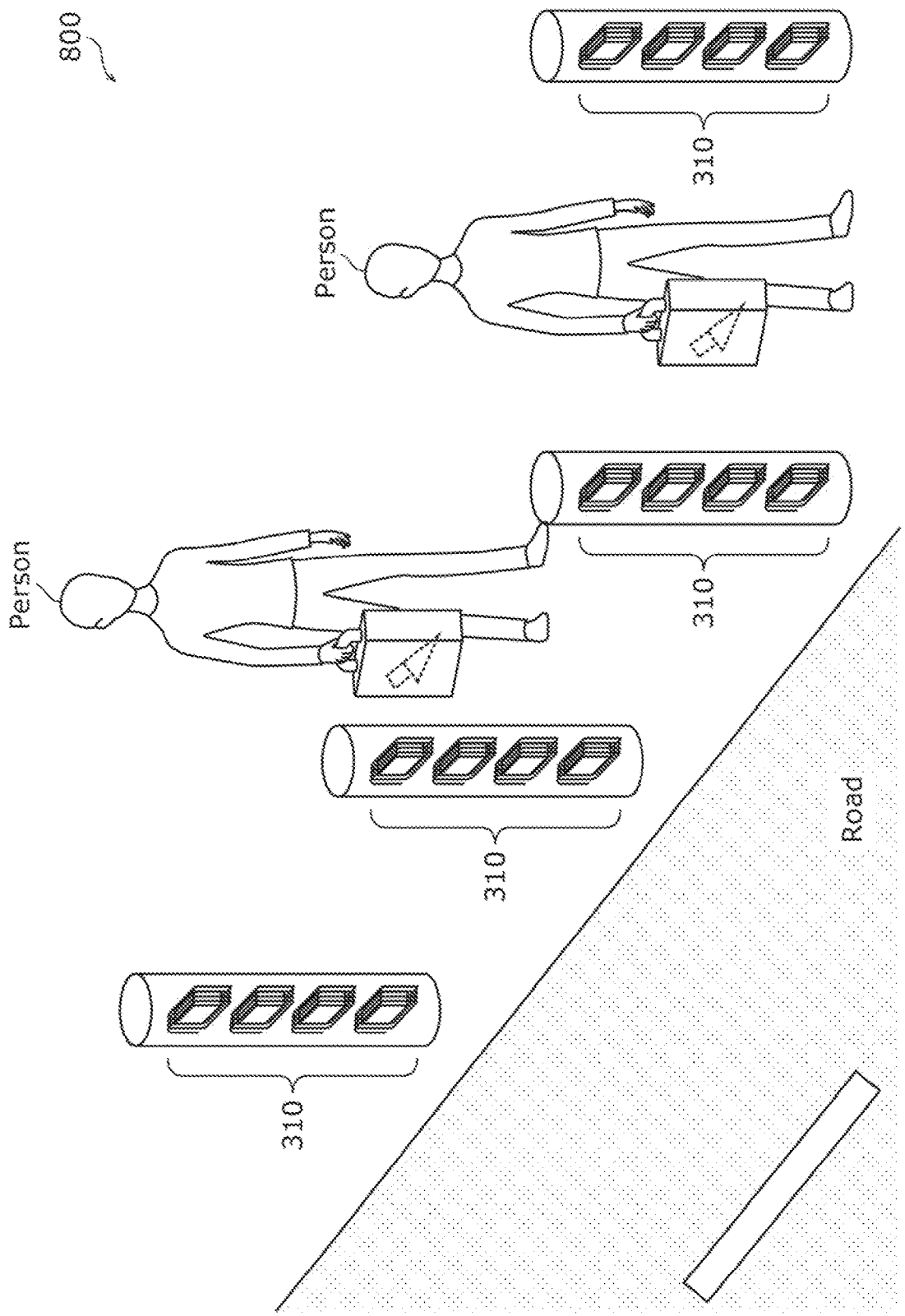
FIG. 16 is a schematic diagram illustrating a sixth example of a body scanner according to an embodiment of the present disclosure.

FIG. 16 is a schematic diagram illustrating a sixth example of a body scanner using magnetic susceptibility distribution visualization device 200 illustrated in FIG. 6. Body scanner 800 illustrated in FIG. 16 is essentially the same as body scanner 700 illustrated in FIG. 15, but the plurality of combined circuits 310 of body scanner 800 are included in a plurality of poles. When a person passes between two of the poles, body scanner 800 induces the first magnetic field component and senses the magnetism of the magnetic field including the second magnetic field component.

Body scanner 800 may induce the first magnetic field component from a first of the two poles and sense the magnetism of the magnetic field including the second magnetic field component at the second of the two poles. Here, the plurality of combined circuits 310 included in the first pole may induce the first magnetic field component one by one. With this, just like body scanner 300, body scanner 800 can induce the first magnetic field component from each of the induction positions in the plane, and can sense the magnetism of the magnetic field including the second magnetic field component at each of the sensing positions in the plane.

Body scanner 800 can then generate an image of, for example, the blade that the person has inside the aluminum case based on the sensing result.

In the example of FIG. 16, each pole contains a plurality of combined circuits 310. However, a first pole of a pair of poles may include a plurality of induction circuits 210, and the second pole of the pair of poles may include a plurality of magnetic sensors 230.

For example, in FIG. 16, a person travels between two poles along a direction parallel to the center line between the two poles. In this case, if the direction in which the person is traveling in FIG. 16 is taken as the y-axis direction in FIG. 4, the y-coordinate of induction circuit 210 relative to the traveling person coincides with the y-coordinate of magnetic sensor 230. Moreover, the plurality of magnetic sensors 230 and the plurality of induction circuits 210 are disposed on opposite sides of the person corresponding to the sample. Thus, for example, the induction position dependent magnetic field function and the imaging function shown in (4-8) and (4-9) can be applied.

Body scanner 800 may detect a blade or the like based on the generated image. When a blade or the like is detected, information indicating the location where the blade or the like was detected, or the location of the person holding the blade or the like, may be notified to an external terminal or the like.

Figure 17:
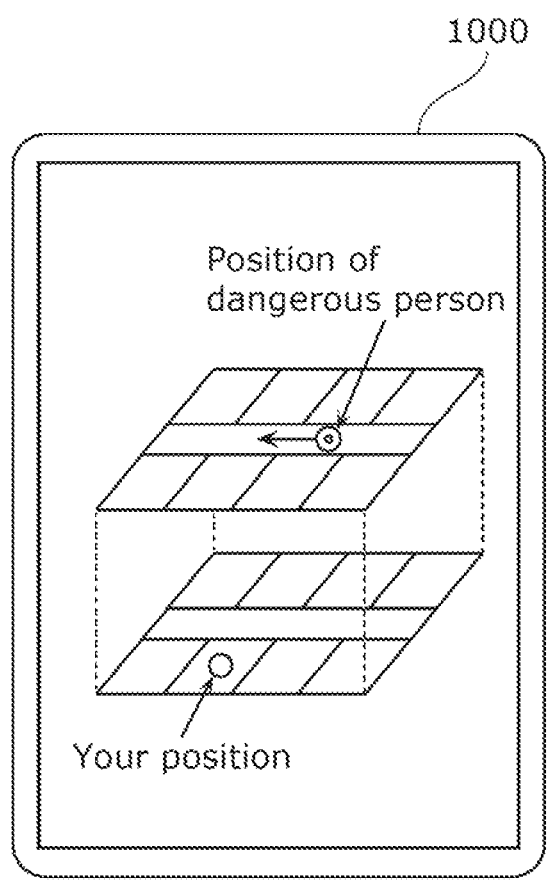
FIG. 17 is a schematic diagram illustrating an example of information displayed on an external terminal according to an embodiment of the present disclosure.

FIG. 17 is a schematic diagram illustrating an example of information displayed on an external terminal by body scanner 800 illustrated in FIG. 16. For example, body scanner 800 generates a plurality of images based on the sensing result obtained from the plurality of poles. Body scanner 800 then detects the blade or the like based on each image and the location corresponding to the blade or the like. Body scanner 800 then transmits information indicating the location corresponding to the blade or the like to external terminal 1000.

The above operations may be performed by, for example, information processing circuit 150 of magnetic susceptibility distribution visualization device 200. For example, information processing circuit 150 determines whether the object corresponding to the sample includes a detection target object, and when the detection target object is determined to be included in the object, outputs information indicating the location of the detection target object or the object to external terminal 1000. External terminal 1000 receives the information indicating the location corresponding to the detection target object, such as the blade, and displays the information as illustrated in FIG. 17.

The above operations may be performed not only by body scanner 800, but also by body scanner 300, 400, 500, 600, 700, or any combination of these, etc.

The above body scanners 300, 400, 500, 600, 700, and 800 correspond to magnetic susceptibility distribution visualization device 200, but may be modified to correspond to magnetic susceptibility distribution visualization device 100. Stated differently, a moving induction circuit 110 may be used instead of a plurality of induction circuits 210, and a moving magnetic sensor 130 may be used instead of a plurality of magnetic sensors 230.

Figure 18:
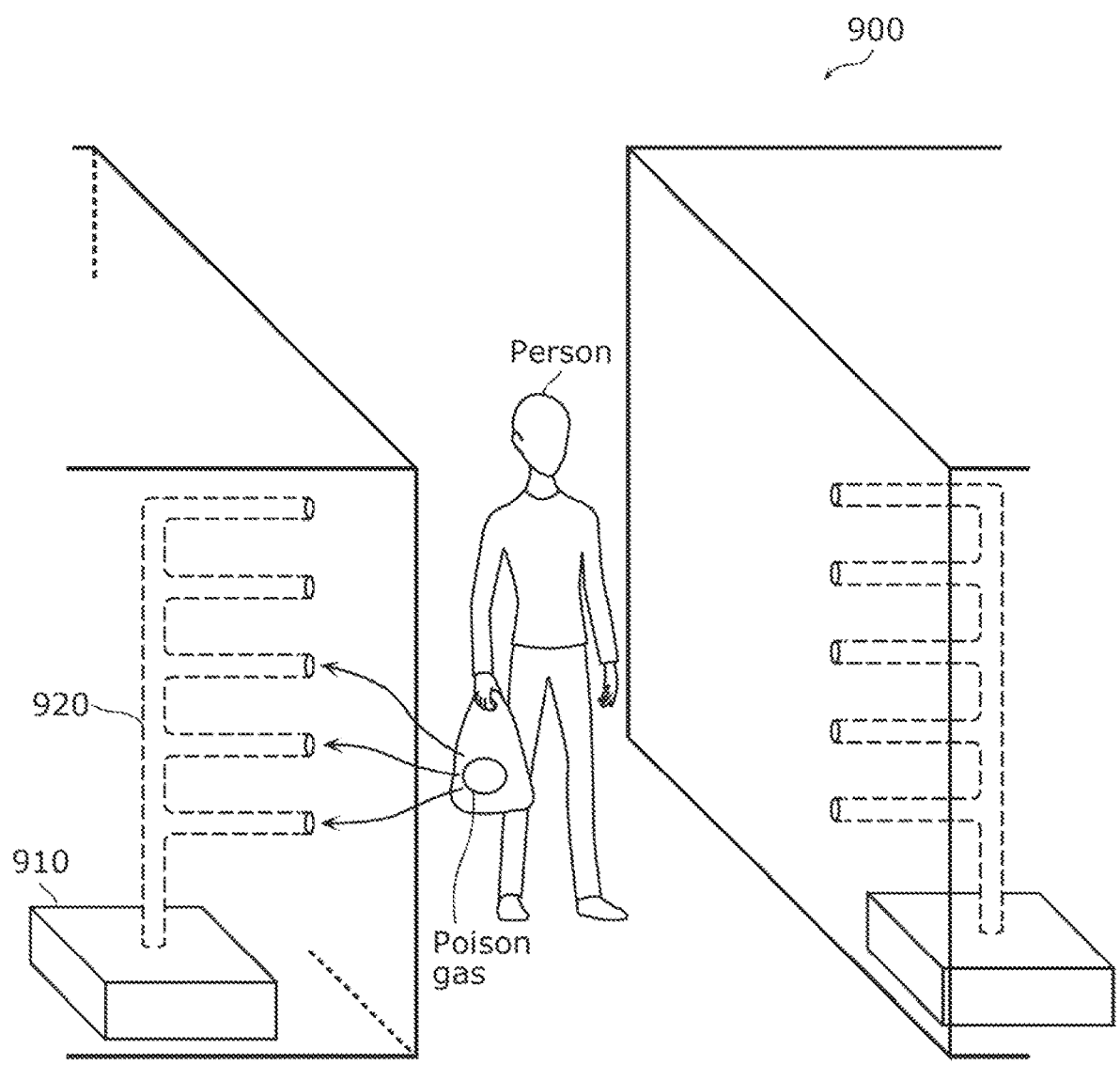
FIG. 18 is a schematic diagram illustrating an example of a security inspection system according to an embodiment of the present disclosure.

FIG. 18 is a schematic diagram illustrating an example of a security inspection system that uses magnetic susceptibility distribution visualization device 100 illustrated in FIG. 1 or magnetic susceptibility distribution visualization device 200 illustrated in FIG. 6.

For example, security inspection system 900 illustrated in FIG. 18 includes magnetic susceptibility distribution visualization device 100 or 200. More specifically, security inspection system 900 may include body scanner 400 illustrated in FIG. 11. Security inspection system 900 measures the quasi-static magnetic field, solves the inverse problem analytically, and reconstructs an image of the field. This enables security inspection system 900 to non-invasively visualize weapons such as blades or firearms concealed in bags, clothes, between clothes and a living body, or inside living bodies, etc., in real time.

Security inspection system 900 further includes gas-phase chemical agent analyzer 910 and pipe 920 to analyze gasoline or poison gas in real time. For example, microscopic holes are one- or two-dimensionally formed in a wall surface and the surrounding air is sucked into multiple channels. The air sucked in is sent to gas-phase chemical agent analyzer 910 through pipe 920.

For example, gas-phase chemical agent analyzer 910 may include a gas chromatographer, a mass spectrometer, an ion mobility analyzer, or a combination of two or more of these, and may also be referred to as a gas classification detector. Gas-phase chemical agent analyzer 910 identifies the air sent to gas-phase chemical agent analyzer 910 and analyzes risk.

Gas-phase chemical agent analyzer 910 shares information on the communication network about the person in possession of the poison gas just like the information about the person in possession of a weapon such as a blade or firearm as described above. Gas-phase chemical agent analyzer 910 may report information about such a dangerous person to the police or other crisis management personnel, and may include such information about the dangerous person in instructions for evacuation routes for citizens in the vicinity.

Note that FIG. 18 is merely a schematic diagram, and the number and size of the holes leading to gas-phase chemical agent analyzer 910 via pipe 920 may be different from the example in FIG. 18. A larger number of smaller holes may be formed in a denser manner.

Security inspection system 900 may also be a security gate. Security inspection system 900 described above corresponds to body scanner 400, but may be modified to correspond to body scanner 300, 500, 600, 700, or 800. For example, gas-phase chemical agent analyzer 910 and pipe 920 may be included in only one wall, in the floor, or in a pole.

Figure 19:
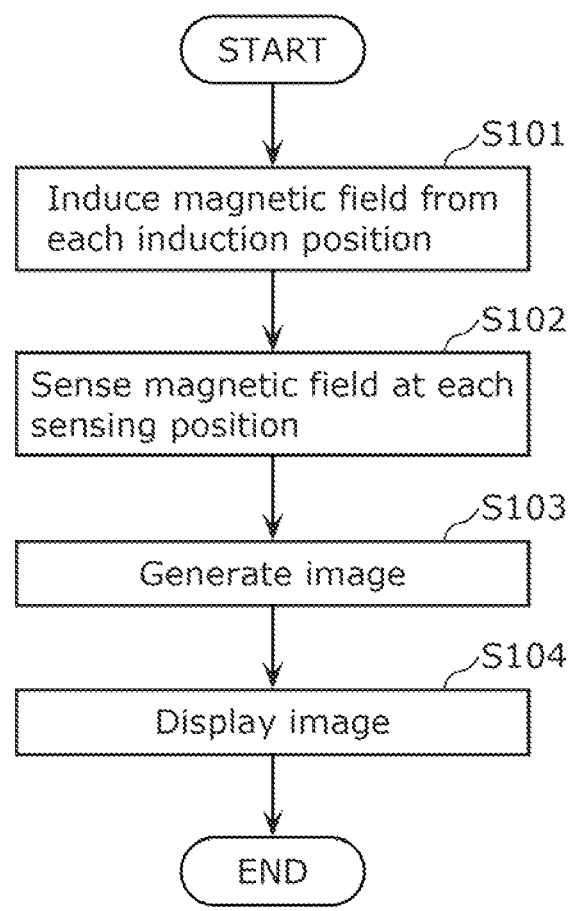
FIG. 19 is a flowchart showing an operation of a magnetic susceptibility distribution visualization device according to an embodiment of the present disclosure.

FIG. 19 is a flowchart showing an operation of a magnetic susceptibility distribution visualization device (100, 200) according to an embodiment.

For example, an induction circuit (110, 210) induces a first magnetic field component from each of induction positions defined outside of an object as positions relative to the object (S101).

A magnetic sensor (130, 230) senses, at each of sensing positions defined outside of the object as positions relative to the object, magnetism in a magnetic field including a second magnetic field component induced from the object by the first magnetic field component (S102). With this, the magnetic sensor (130, 230) senses magnetism at sensing positions for each of the induction positions.

An information processing circuit (150) obtains the magnetism sensing result and generates an image showing a magnetic susceptibility distribution of an area including the interior of the object based on the sensing result (S103). For example, the information processing circuit (150) displays the image on a display (160) (S104). Alternatively, the information processing circuit (150) may print the image or transmit the image to another device.

When generating the image, the information processing circuit (150) calculates an induction position dependent magnetic field function using the sensing result as a boundary condition. The induction position dependent magnetic field function is a function that takes a virtual induction position of the first magnetic field component and a magnetism virtual sensing position as inputs, and outputs the magnetic strength at the virtual sensing position.

The information processing circuit (150) then calculates an imaging function. The imaging function takes an imaging target position as an input and outputs an image intensity at the imaging target position, and is defined based on a strength output from the induction position dependent magnetic field function in response to inputting the imaging target position, as the virtual induction position and the virtual sensing position, into the induction position dependent magnetic field function. The information processing circuit (150) then generates the image based on the imaging function.

This enables the magnetic susceptibility distribution visualization device (100, 200) to generate an image showing the magnetic susceptibility distribution of an area including the interior of the object with high accuracy based on the magnetism sensing result based on various combinations of the induction positions and the sensing positions.

For example, the information processing circuit (150) may calculate, as the induction position dependent magnetic field function, a solution of the Laplace equation which the induction position dependent magnetic field function satisfies, using the sensing result as the boundary condition. This enables the magnetic susceptibility distribution visualization device (100, 200) to properly derive the induction position dependent magnetic field function based on the sensing result and the Laplace equation related to the multipath problem in a static or quasi-static field.

For example, the information processing circuit (150) may calculate, as the imaging function, a limit value of the induction position dependent magnetic field function, by performing a limit operation on the induction position dependent magnetic field function that directs the virtual induction position and the virtual sensing position input into the induction position dependent magnetic field function toward the imaging target position. This enables the magnetic susceptibility distribution visualization device (100, 200) to properly derive the imaging function based on the induction position dependent magnetic field function.

For example, the induction positions may be defined in a first plane. The sensing positions may be defined in a second plane that is the same as or different than the first plane. Stated differently, the sensing positions may be defined in a first plane where the induction positions are defined, or in a second plane different than the first plane. The second plane may be parallel to the first plane.

This enables the magnetic susceptibility distribution visualization device (100, 200) to inhibit an increase in the size of the space required to place the induction circuit (110, 210) and the magnetic sensor (130, 230). The magnetic susceptibility distribution visualization device (100, 200) can also inhibit complication of the calculation process.

For example, the sensing positions may be located on a first side of the object and the induction positions may be located on a second opposite side of the object. This enables the magnetic susceptibility distribution visualization device (100, 200) to sense the magnetism at each of the sensing positions, which are on the opposite side of the object relative to the induction positions. Accordingly, the magnetic susceptibility distribution visualization device (100, 200) can inhibit the influence of the first magnetic field component induced by the induction circuit (110, 210) when sensing the magnetism at each of the sensing positions.

For example, the sensing positions and the induction positions may be located on the same side of the object. This enables the magnetic susceptibility distribution visualization device (100, 200) to sense the magnetism at each of the sensing positions, which are on the same side of the object relative to the induction positions. Accordingly, the magnetic susceptibility distribution visualization device (100, 200) can inhibit an increase in the size of the space required to place the induction circuit (110, 210) and the magnetic sensor (130, 230).

For example, the induction circuit (110, 210) may induce the first magnetic field component from each of the induction positions by moving to each of the induction positions. The magnetic sensor (130, 230) may sense the magnetism at each of the sensing positions by moving to each of the sensing positions.

This enables the magnetic susceptibility distribution visualization device (100, 200) to implement one induction circuit (110, 210) for a plurality of induction positions and one magnetic sensor (130, 230) for a plurality of sensing positions. Accordingly, the magnetic susceptibility distribution visualization device (100, 200) can inhibit an increase in resource cost.

For example, the induction circuit (110, 210) may include a plurality of induction circuits (110, 210) disposed at the induction positions. The magnetic sensor (130, 230) may include a plurality of magnetic sensors (130, 230) disposed at the sensing positions.

This enables the magnetic susceptibility distribution visualization device (100, 200) to induce a magnetic field component from each of the induction positions and to sense the magnetism at each of the sensing positions without moving the induction circuit (110, 210) or the magnetic sensor (130, 230). Accordingly, the magnetic susceptibility distribution visualization device (100, 200) can rapidly obtain the sensing result corresponding to a plurality of induction positions and a plurality of sensing positions.

Note that the plurality of induction circuits (110, 210) are not limited to a one-to-one correspondence to the plurality of induction positions; two or more of the plurality of induction circuits (110, 210) may correspond to a single induction position (area). Similarly, the plurality of magnetic sensors (130, 230) are not limited to a one-to-one correspondence to the plurality of sensing positions; two or more of the plurality of magnetic sensors (130, 230) may correspond to a single sensing position (area).

For example, the plurality of induction circuits (110, 210) may be disposed in a first plane. The plurality of magnetic sensors (130, 230) may be disposed in a second plane that is the same as or different than the first plane. Stated differently, the plurality of magnetic sensors (130, 230) may be disposed in a first plane where the plurality of induction circuits (110, 210) are disposed, or in a second plane different than the first plane. The second plane may be parallel to the first plane.

This enables the magnetic susceptibility distribution visualization device (100, 200) to rapidly obtain the sensing result corresponding to the induction positions in the first plane and the sensing positions in the second plane.

For example, the plurality of induction circuits (110, 210) may be disposed on a first straight line. The plurality of magnetic sensors (130, 230) may be disposed on a second straight line that is different than the first straight line. Stated differently, the plurality of magnetic sensors (130, 230) may be disposed on a first straight line on which the plurality of induction circuits (110, 210) are disposed, or on a second straight line different than the first straight line. The second straight line may be parallel to the first straight line.

This enables the magnetic susceptibility distribution visualization device (100, 200) to reduce the space where the induction circuits (110, 210) are disposed and the space where the magnetic sensor (130, 230) are disposed.

For example, the object may move. The induction circuit (110, 210) may induce the first magnetic field component from each of the induction positions defined relative to the object that moves, by inducing the first magnetic field component from a predetermined position at different times. The magnetic sensor (130, 230) may sense the magnetism at each of the sensing positions defined relative to the object that moves, by sensing the magnetism at a predetermined position at different times.

This enables the magnetic susceptibility distribution visualization device (100, 200) to induce a magnetic field component from each of the induction positions and to sense the magnetism at each of the sensing positions without providing many induction circuits (110, 210) or many magnetic sensors (130, 230) and without moving the induction circuit (110, 210) or the magnetic sensor (130, 230).

For example, the induction circuit (110, 210) may be included in a first wall. The magnetic sensor (130, 230) may be included in a second wall that is the same as or different than the first wall. Stated differently, the magnetic sensor (130, 230) may be included in the first wall where the induction circuit (110, 210) is included, or in a second wall different than that first wall. The first wall and the second wall may be opposing walls. Moreover, for example, the induction circuit (110, 210) and the magnetic sensor (130, 230) may be included in the floor.

For example, the induction circuit (110, 210) may be included in a first pole. The magnetic sensor (130, 230) may be included in a second pole that is the same as or different than the first pole. Stated differently, the magnetic sensor (130, 230) may be included in the first pole where the induction circuit (110, 210) is included, or in a second pole different than that first pole.

These configurations enable the induction circuit (110, 210) and the magnetic sensor (130, 230) to blend into the landscape. This enables the magnetic susceptibility distribution visualization device (100, 200) to generate an image showing the magnetic susceptibility distribution without being noticed by people.

In a three-dimensional space of x-coordinates, y-coordinates, and z-coordinates, the virtual induction position may be expressed as $(y_1, z_1)$. The virtual sensing position may be expressed as $(x, y_2, z_2)$. The z-coordinate of the position of the induction circuit (110, 210) may be defined as 0. The z-coordinate of the position of the magnetic sensor (130, 230) may be defined as $z_0$. When the sensing positions and the induction positions are on opposite sides of the object, the induction position dependent magnetic field function may be defined as follows.

[Math. 44]

$$\Phi(x, y_1, y_2, z_1, z_2) =$$

$$\int_{-\infty}^{\infty}\int_{-\infty}^{\infty}\int_{-\infty}^{\infty} a(k_x, k_{y_1}, k_{y_2})e^{ik_x x + ik_{y_1} y_1 + ik_{y_2} y_2} e^{k_{y_1} z_1 - \sqrt{k_x^2 + k_{y_2}^2}\, z_2}\, dk_x dk_{y_1} dk_{y_2},$$

$$a(k_x, k_{y_1}, k_{y_2}) = e^{z_0 \sqrt{k_x^2 + k_{y_2}^2}}\, \overline{\Phi}(k_x, k_{y_1}, k_{y_2}, z_1 = 0, z_2 = z_0)$$

Here, the Fourier transform image of the sensing result is expressed as follows.

$$\overline{\Phi}(k_x, k_{y_1}, k_{y_2}, z_1 = 0, z_2 = z_0) \quad \text{[Math. 45]}$$

Here, $k_x$, $k_{y_1}$, and $k_{y_2}$ are respective wavenumbers of x, $y_1$, and $y_2$. The imaging function may be defined as follows.

[Math. 46]

$$\varphi(x, y, z) = \lim_{\substack{y_2 \to y_1 = y \\ z_2 \to z_1 = z}} \Phi(x, y_1, y_2, z_1, z_2) = \lim_{\substack{y_2 \to y_1 = y \\ z_2 \to z_1 = z}}$$

$$\int_{-\infty}^{\infty}\int_{-\infty}^{\infty}\int_{-\infty}^{\infty} a(k_x, k_{y_1}, k_{y_2})e^{ik_x x + ik_{y_1} y_1 + ik_{y_2} y_2} e^{k_{y_1} z_1 - \sqrt{k_x^2 + k_{y_2}^2}\, z_2}\, dk_x dk_{y_1} dk_{y_2}$$

This enables the magnetic susceptibility distribution visualization device (100, 200) to generate an image showing the magnetic susceptibility distribution with high accuracy using the induction position dependent magnetic field function expressed in the equation above and the imaging function expressed in the equation above.

In a three-dimensional space of x-coordinates, y-coordinates, and z-coordinates, the virtual induction position may be expressed as ($y_1$, $z_1$). The virtual sensing position may be expressed as (x, $y_2$, $z_2$). The z-coordinate of the position of the induction circuit (110, 210) may be defined as 0. The z-coordinate of the position of the magnetic sensor (130, 230) may be defined as $z_0$. When the sensing positions and the induction positions are on the same side of the object, the induction position dependent magnetic field function may be defined as follows.

[Math. 47]

$$\Phi(x, y_1, y_2, z_1, z_2) =$$

$$\int_{-\infty}^{\infty}\int_{-\infty}^{\infty}\int_{-\infty}^{\infty} a(k_x, k_{y_1}, k_{y_2})e^{ik_x x + ik_{y_1} y_1 + ik_{y_2} y_2} e^{-k_{y_1} z_1 - \sqrt{k_x^2 + k_{y_2}^2}\, z_2}\, dk_x dk_{y_1} dk_{y_2},$$

$$a(k_x, k_{y_1}, k_{y_2}) = e^{z_0 \sqrt{k_x^2 + k_{y_2}^2}}\, \overline{\Phi}(k_x, k_{y_1}, k_{y_2}, z_1 = 0, z_2 = z_0)$$

Here, the Fourier transform image of the sensing result is expressed as follows.

$$\overline{\Phi}(k_x, k_{y_1}, k_{y_2}, z_1 = 0, z_2 = z_0) \quad \text{[Math. 48]}$$

Here, $k_x$, $k_{y_1}$, and $k_{y_2}$ are respective wavenumbers of x, $y_1$, and $y_2$. The imaging function may be defined as follows.

[Math. 49]

$$\varphi(x, y, z) = \lim_{\substack{y_2 \to y_1 = y \\ z_2 \to z_1 = z}} \Phi(x, y_1, y_2, z_1, z_2) = \lim_{\substack{y_2 \to y_1 = y \\ z_2 \to z_1 = z}}$$

$$\int_{-\infty}^{\infty}\int_{-\infty}^{\infty}\int_{-\infty}^{\infty} a(k_x, k_{y_1}, k_{y_2})e^{ik_x x + ik_{y_1} y_1 + ik_{y_2} y_2} e^{-k_{y_1} z_1 - \sqrt{k_x^2 + k_{y_2}^2}\, z_2}\, dk_x dk_{y_1} dk_{y_2}$$

This enables the magnetic susceptibility distribution visualization device (100, 200) to generate an image showing the magnetic susceptibility distribution with high accuracy using the induction position dependent magnetic field function expressed in the equation above and the imaging function expressed in the equation above.

In a three-dimensional space of x-coordinates, y-coordinates, and z-coordinates, the virtual induction position may be expressed as ($x_1$, y, $z_1$). The virtual sensing position may be expressed as ($x_2$, y, $z_2$). The z-coordinate of the position of the induction circuit (110, 210) may be defined as 0. The z-coordinate of the position of the magnetic sensor (130, 230) may be defined as $z_0$. When the sensing positions and the induction positions are on opposite sides of the object, the induction position dependent magnetic field function may be defined as follows.

[Math. 50]

$$\Phi(x_1, x_2, y, z_1, z_2) = \int_{-\infty}^{\infty}\int_{-\infty}^{\infty}\int_{-\infty}^{\infty} a(k_{x_1}, k_{x_2}, k_y)$$

$$e^{ik_{x_1} x_1 + ik_{x_2} x_2 + ik_y y} e^{\sqrt{k_{x_1}^2 + k_y^2}\, z_1 - \sqrt{k_{x_2}^2 + k_y^2}\, z_2}\, dk_{x_1} dk_{x_2} dk_y,$$

$$a(k_{x_1}, k_{x_2}, k_y) = e^{z_0 \sqrt{k_{x_2}^2 + k_y^2}}\, \overline{\Phi}(k_{x_1}, k_{x_2}, k_y, z_1 = 0, z_2 = z_0)$$

Here, the Fourier transform image of the sensing result is expressed as follows.

$$\overline{\Phi}(k_{x_1}, k_{x_2}, k_y, z_1 = 0, z_2 = z_0) \quad \text{[Math. 51]}$$

Here, $k_x$, $k_{y_1}$, and $k_{y_2}$ are respective wavenumbers of x, $y_1$, and $y_2$. The imaging function may be defined as follows.

[Math. 52]

$$\varphi(x, y, z) = \lim_{\substack{x_2 \to x_1 = x \\ z_2 \to z_1 = z}} \Phi(x_1, x_2, y, z_1, z_2) =$$

$$\lim_{\substack{x_2 \to x_1 = x \\ z_2 \to z_1 = z}} \int_{-\infty}^{\infty}\int_{-\infty}^{\infty}\int_{-\infty}^{\infty} a(k_{x_1}, k_{x_2}, k_y)e^{ik_{x_1} x_1 + ik_{x_2} x_2 + ik_y y}$$

$$e^{\sqrt{k_{x_1}^2 + k_y^2}\, z_1 - \sqrt{k_{x_2}^2 + k_y^2}\, z_2}\, dk_{x_1} dk_{x_2} dk_y$$

This enables the magnetic susceptibility distribution visualization device (100, 200) to generate an image showing the magnetic susceptibility distribution with high accuracy using the induction position dependent magnetic field function expressed in the equation above and the imaging function expressed in the equation above.

In a three-dimensional space of x-coordinates, y-coordinates, and z-coordinates, the virtual induction position may be expressed as ($x_1$, y, $z_1$). The virtual sensing position may be expressed as ($x_2$, y, $z_2$). The z-coordinate of the position of the induction circuit (110, 210) may be defined as 0. The z-coordinate of the position of the magnetic sensor (130, 230) may be defined as $z_0$. When the sensing positions and the induction positions are on the same side of the object, the induction position dependent magnetic field function may be defined as follows.

[Math. 53]

$$\Phi(x_1, x_2, y, z_1, z_2) = \int_{-\infty}^{\infty}\int_{-\infty}^{\infty}\int_{-\infty}^{\infty} a(k_{x_1}, k_{x_2}, k_y)$$

$$e^{ik_{x_1}x_1 + ik_{x_2}x_2 + ik_y y} e^{-\sqrt{k_{x_1}^2 + k_y^2}\,z_1 - \sqrt{k_{x_2}^2 + k_y^2}\,z_2} dk_{x_1} dk_{x_2} dk_y,$$

$$a(k_{x_1}, k_{x_2}, k_y) = e^{z_0\sqrt{k_{x_2}^2 + k_y^2}} \Phi(k_{x_1}, k_{x_2}, k_y, z_1 = 0, z_2 = z_0)$$

Here, the Fourier transform image of the sensing result is expressed as follows.

$$\Phi(k_{x_1}, k_{x_2}, k_y, z_1 = 0, z_2 = z_0) \quad \text{[Math. 54]}$$

Here, $k_x$, $k_{y1}$, and $k_{y2}$ are respective wavenumbers of x, $y_1$, and $y_2$. The imaging function may be defined as follows.

[Math. 55]

$$\varphi(x, y, z) = \lim_{\substack{x_2 \to x_1 = x \\ z_2 \to z_1 = z}} \Phi(x_1, x_2, y, z_1, z_2) =$$

$$\lim_{\substack{x_2 \to x_1 = x \\ z_2 \to z_1 = z}} \int_{-\infty}^{\infty}\int_{-\infty}^{\infty}\int_{-\infty}^{\infty} a(k_{x_1}, k_{x_2}, k_y) e^{ik_{x_1}x_1 + ik_{x_2}x_2 + ik_y y}$$

$$e^{-\sqrt{k_{x_1}^2 + k_y^2}\,z_1 - \sqrt{k_{x_2}^2 + k_y^2}\,z_2} dk_{x_1} dk_{x_2} dk_y$$

This enables the magnetic susceptibility distribution visualization device (100, 200) to generate an image showing the magnetic susceptibility distribution with high accuracy using the induction position dependent magnetic field function expressed in the equation above and the imaging function expressed in the equation above.

For example, based on an image, information processing circuit (150) may determine whether the object includes a detection target object, and when the detection target object is determined to be included in the object, outputs information indicating the location of the detection target object or the object to an external terminal (1000). This enables the magnetic susceptibility distribution visualization device (100, 200) to notify the location of a specific detection target object or the location of an object including a specific detection target object.

Hereinbefore, an aspect of the magnetic susceptibility distribution visualization device has been described based on embodiments, but aspects of the magnetic susceptibility distribution visualization device are not limited to the embodiments. Various modifications conceivable by those skilled in the art may be made to the embodiments, and elements in the embodiments may be combined discretionarily. For example, a process executed by a specific element in an embodiment may be executed by a different element instead. Moreover, the processing order of the processes may be changed, and the processes may be performed in parallel.

A magnetic susceptibility distribution visualization method including steps performed by the elements included in the magnetic susceptibility distribution visualization device may be executed by an arbitrary device or system. For example, part or all of the magnetic susceptibility distribution visualization method may be executed by a computer including, for example, a processor, memory, and an input/output circuit. In such cases, the magnetic susceptibility distribution visualization method may be executed by a program for causing a computer to execute the magnetic susceptibility distribution visualization method being executed by the computer.

The program may be recorded on a non-transitory computer-readable recording medium.

Each of the elements of the magnetic susceptibility distribution visualization device may be configured in the form of dedicated hardware, in the form of general-purpose hardware that executes the above program or the like, or any combination thereof. For example, the general-purpose hardware may be configured in the form of memory on which a program is recorded and a general-purpose processor that reads the program from the memory and executes the program. Here, the memory may be semiconductor memory or a hard disk, and the general-purpose processor may be a central processing unit (CPU) or the like.

The dedicated hardware may be configured in the form of memory and a dedicated processor or the like. For example, the dedicated processor may reference the memory for recording the measurement data and execute the magnetic susceptibility distribution visualization method described above.

Each of the elements of the magnetic susceptibility distribution visualization device may be an electrical circuit. The electrical circuits may collectively form a single electrical circuit and, alternatively, may form individual electrical circuits. These electrical circuits may correspond to dedicated hardware or general-purpose hardware that executes the above program, for example.

The magnetic susceptibility distribution visualization device can also be described as an image generation device. The magnetic susceptibility distribution visualization device may be a security inspection device such as a body scanner, and may be included in a security inspection device. Although an example of a body scanner is given above, application examples are not limited to this example. The magnetic susceptibility distribution visualization device may be used to test electrical circuits or to test reinforced structures. The magnetic susceptibility distribution visualization device may also be used in medical diagnostics, where the human body is examined using a contrast agent containing magnetic material.

Although a magnetic field is exemplified in the above description, the concepts of the present disclosure are applicable to any field that satisfies the Laplace equation related to the multipath problem in a static or quasi-static field. A quasi-static field may be a substantially static field, such as an electromagnetic field of 100 kHz or less, which can be regarded as having no wave properties. More specifically, instead of a magnetic field, an electric field may be used, a temperature field may be used, or a pressure field may be used.

Therefore, the above magnetic susceptibility distribution visualization device may be described as an external field response distribution visualization device. For example, the external field response distribution visualization device generates an image showing the external field response distribution, which is a distribution of responses to an external field. The magnetic sensor described above may be a sensor that senses the strength of a field. Instead of magnetic strength, field strength can be used. The induction position dependent magnetic field function can also be expressed as an induction position dependent field function.

In other words, "magnetic field" in the above description can be replaced with simply "field", and "magnetic susceptibility distribution" can be replaced with "external field response distribution". For example, the induction circuit induces a first field component from a plurality of induction positions. This induces a second field component from the object. The sensor senses the strength of the field including the second field component at each of the sensing positions. The information processing circuit obtains the sensing result of the strength and generates an image showing an external field response distribution of an area including the interior of the object based on the sensing result.

In such cases, the information processing circuit calculates the induction position dependent field function using the sensing result as a boundary condition, and calculates the imaging function based on the induction position dependent field function. The information processing circuit then generates the image based on the imaging function. This enables the external field response distribution visualization device to generate an image showing the external field response distribution of an area including the interior of the object with high accuracy.

INDUSTRIAL APPLICABILITY

One aspect of the present disclosure is useful for magnetic susceptibility visualization devices that generate images showing magnetic susceptibility distributions, and is applicable to magnetic field diagnostic devices, inspection of electronic components, seismic inspection of reinforced structures, medical diagnosis, and security inspection systems.

REFERENCE SIGNS LIST 100, 200 magnetic susceptibility distribution visualization device (external field response distribution visualization device)
110, 210 induction circuit
120 induction circuit actuator
130, 230 magnetic sensor (sensor)
140 magnetic sensor actuator (sensor actuator)
150 information processing circuit
160 display
170 sample table
220 induction circuit support structure
231 soft layer
232 tunnel layer
233 PIN layer (magnetization fixing layer)
240 magnetic sensor support structure (sensor support structure)
300, 400, 500, 600, 700, 800 body scanner
310 combined circuit
900 security inspection system
910 gas-phase chemical agent analyzer
920 pipe
1000 external terminal

The invention claimed is:

1. An external field response distribution visualization device that generates an image showing an external field response distribution, which is a distribution of responses to an external field, the external field response distribution visualization device comprising:

one or more induction circuits that sequentially induce a first field component from each of actual induction positions defined outside of an object as positions relative to the object;

one or more sensors that sense, at each of actual sensing positions defined outside of the object as positions relative to the object, a strength of a field including a second field component induced from the object by the first field component sequentially induced from each of the actual induction positions, to sense the strength of the field at the actual sensing positions for each of the actual induction positions; and an information processing circuit that obtains a sensing result of the strength of the field and generates the image showing the external field response distribution of an area including an interior of the object based on the sensing result, wherein the information processing circuit:

derives an induction position dependent field function that takes a virtual induction position and a virtual sensing position as inputs and outputs a strength of the field at the virtual sensing position, using the sensing result as a boundary condition;

derives an imaging function that takes an imaging target position as an input and outputs an image intensity at the imaging target position, and is defined based on a strength output from the induction position dependent field function in response to inputting the imaging target position, as the virtual induction position and the virtual sensing position, into the induction position dependent field function; and generates the image based on the imaging function.

2. The external field response distribution visualization device according to claim 1, wherein
the information processing circuit derives the induction position dependent field function by deriving a solution of a Laplace equation which the induction position dependent field function satisfies, using the sensing result as the boundary condition.

3. The external field response distribution visualization device according to claim 1, wherein
the information processing circuit derives the imaging function that corresponds to a limit value of the induction position dependent field function, by performing a limit operation on the induction position dependent field function that directs the virtual induction position and the virtual sensing position input into the induction position dependent field function toward the imaging target position.

4. The external field response distribution visualization device according to claim 1, wherein
the actual induction positions are defined in a first plane, and
the actual sensing positions are defined in a second plane that is the same as or different than the first plane.

5. The external field response distribution visualization device according to claim 1, wherein
the actual sensing positions are located on a first side of the object and the actual induction positions are on a second opposite side of the object.

6. The external field response distribution visualization device according to claim 1, wherein
the actual sensing positions and the actual induction positions are located on the same side of the object.

7. The external field response distribution visualization device according to claim 1, wherein the one or more induction circuits is a single induction circuit that induces the first field component from each of the actual induction positions by moving to each of the actual induction positions, and the one or more sensors is a single sensor that senses the strength of the field at each of the actual sensing positions by moving to each of the actual sensing positions.

8. The external field response distribution visualization device according to claim 1, wherein
the one or more induction circuits are a plurality of induction circuits disposed at the actual induction positions, and
the one or more sensors are a plurality of sensors disposed at the actual sensing positions.

9. The external field response distribution visualization device according to claim 8, wherein
the plurality of induction circuits are disposed in a first plane, and
the plurality of sensors are disposed in a second plane that is the same as or different than the first plane.

10. The external field response distribution visualization device according to claim 8, wherein
the plurality of induction circuits are disposed on a first straight line, and
the plurality of sensors are disposed on a second straight line that is the same as or different than the first straight line.

11. The external field response distribution visualization device according to claim 1, wherein
the object moves,
the one or more induction circuits induce the first field component from each of the actual induction positions defined relative to the object that moves, by inducing the first field component from a predetermined position at different times, and
the one or more sensors sense the strength of the field at each of the actual sensing positions defined relative to the object that moves, by sensing the strength of the field at a predetermined position at different times.

12. The external field response distribution visualization device according to claim 1, wherein
the one or more induction circuits are included in a first wall, and
the one or more sensors are included in a second wall that is the same as or different than the first wall.

13. The external field response distribution visualization device according to claim 1, wherein
the one or more induction circuits and the one or more sensors are included in a floor.

14. The external field response distribution visualization device according to claim 1, wherein
the one or more induction circuits are included in a first pole, and
the one or more sensors are included in a second pole that is the same as or different than the first pole.

15. The external field response distribution visualization device according to claim 5, wherein
in a three-dimensional space of x-coordinates, y-coordinates, and z-coordinates, the virtual induction position is expressed as $(y_1, z_1)$, the virtual sensing position is expressed as $(x, y_2, z_2)$, a z-coordinate of a position of the one or more induction circuits is defined as 0, and a z-coordinate of a position of the one or more sensors is defined as $z_0$,
the induction position dependent field function is defined as:

[Math. 1]

$$\Phi(x, y_1, y_2, z_1, z_2) = \int_{-\infty}^{\infty}\int_{-\infty}^{\infty}\int_{-\infty}^{\infty} a(k_x, k_{y_1}, k_{y_2}) e^{ik_x x + ik_{y_1} y_1 + ik_{y_2} y_2} e^{k_{y_1} z_1 - \sqrt{k_x^2 + k_{y_2}^2}\, z_2} dk_x dk_{y_1} dk_{y_2},$$

$$a(k_x, k_{y_1}, k_{y_2}) = e^{z_0 \sqrt{k_x^2 + k_{y_2}^2}} \tilde{\Phi}(k_x, k_{y_1}, k_{y_2}, z_1 = 0, z_2 = z_0),$$

a Fourier transform image of the sensing result is expressed as:

$$\tilde{\Phi}(k_x, k_{y_1}, k_{y_2}, z_1 = 0, z_2 = z_0) \quad [\text{Math. 2}]$$

where $k_x$, $k_{y_1}$, and $k_{y_2}$ are respective wavenumbers of x, $y_1$, and $y_2$, and
the imaging function is defined as:

[Math. 3]

$$\varphi(x, y, z) = \lim_{\substack{y_2 \to y_1 = y \\ z_2 \to z_1 = z}} \Phi(x, y_1, y_2, z_1, z_2) = \lim_{\substack{y_2 \to y_1 = y \\ z_2 \to z_1 = z}} \int_{-\infty}^{\infty}\int_{-\infty}^{\infty}\int_{-\infty}^{\infty} a(k_x, k_{y_1}, k_{y_2}) e^{ik_x x + ik_{y_1} y_1 + ik_{y_2} y_2} e^{k_{y_1} z_1 - \sqrt{k_x^2 + k_{y_2}^2}\, z_2} dk_x dk_{y_1} dk_{y_2}.$$

16. The external field response distribution visualization device according to claim 6, wherein
in a three-dimensional space of x-coordinates, y-coordinates, and z-coordinates, the virtual induction position is expressed as $(y_1, z_1)$, the virtual sensing position is expressed as $(x, y_2, z_2)$, a z-coordinate of a position of the one or more induction circuits is defined as 0, and a z-coordinate of a position of the one or more sensors is defined as $z_0$,
the induction position dependent field function is defined as:

[Math. 4]

$$\Phi(x, y_1, y_2, z_1, z_2) = \int_{-\infty}^{\infty}\int_{-\infty}^{\infty}\int_{-\infty}^{\infty} a(k_x, k_{y_1}, k_{y_2}) e^{ik_x x + ik_{y_1} y_1 + ik_{y_2} y_2} e^{-k_{y_1} z_1 - \sqrt{k_x^2 + k_{y_2}^2}\, z_2} dk_x dk_{y_1} dk_{y_2},$$

$$a(k_x, k_{y_1}, k_{y_2}) = e^{z_0 \sqrt{k_x^2 + k_{y_2}^2}} \tilde{\Phi}(k_x, k_{y_1}, k_{y_2}, z_1 = 0, z_2 = z_0),$$

a Fourier transform image of the sensing result is expressed as:

$$\tilde{\Phi}(k_x, k_{y_1}, k_{y_2}, z_1 = 0, z_2 = z_0) \quad [\text{Math. 5}]$$

where $k_x$, $k_{y_1}$, and $k_{y_2}$ are respective wavenumbers of x, $y_1$, and $y_2$, and
the imaging function is defined as:

[Math. 6]

$$\varphi(x, y, z) = \lim_{\substack{y_2 \to y_1 = y \\ z_2 \to z_1 = z}} \Phi(x, y_1, y_2, z_1, z_2) = \lim_{\substack{y_2 \to y_1 = y \\ z_2 \to z_1 = z}} \int_{-\infty}^{\infty}\int_{-\infty}^{\infty}\int_{-\infty}^{\infty} a(k_x, k_{y_1}, k_{y_2}) e^{ik_x x + ik_{y_1} y_1 + ik_{y_2} y_2} e^{-k_{y_1} z_1 - \sqrt{k_x^2 + k_{y_2}^2}\, z_2} dk_x dk_{y_1} dk_{y_2}.$$

17. The external field response distribution visualization device according to claim 5, wherein
in a three-dimensional space of x-coordinates, y-coordinates, and z-coordinates, the virtual induction position is expressed as $(x_1, y, z_1)$, the virtual sensing position is expressed as $(x_2, y, z_2)$, a z-coordinate of a position of the one or more induction circuits is defined as 0, and a z-coordinate of a position of the one or more sensors is defined as $z_0$,
the induction position dependent field function is defined as:

[Math. 7]

$$\Phi(x_1, x_2, y, z_1, z_2) = \int_{-\infty}^{\infty}\int_{-\infty}^{\infty}\int_{-\infty}^{\infty} a(k_{x_1}, k_{x_2}, k_y)$$
$$e^{ik_{x_1}x_1 + ik_{x_2}x_2 + ik_y y} e^{\sqrt{k_{x_1}^2 + k_y^2}\, z_1 - \sqrt{k_{x_2}^2 + k_y^2}\, z_2} dk_{x_1} dk_{x_2} dk_y,$$

$$a(k_{x_1}, k_{x_2}, k_y) = e^{z_0 \sqrt{k_{x_2}^2 + k_y^2}} \Phi(k_{x_1}, k_{x_2}, k_y, z_1 = 0, z_2 = z_0),$$

a Fourier transform image of the sensing result is expressed as:

$$\Phi(k_{x_1}, k_{x_2}, k_y, z_1=0, z_2=z_0) \quad \text{[Math. 8]}$$

where $k_{x_1}$, $k_{x_2}$, and $k_y$ are respective wavenumbers of $x_1$, $x_2$, and $y$, and
the imaging function is defined as:

[Math. 9]

$$\varphi(x, y, z) = \lim_{\substack{x_2 \to x_1 = x \\ z_2 \to z_1 = z}} \Phi(x_1, x_2, y, z_1, z_2) =$$

$$\lim_{\substack{x_2 \to x_1 = x \\ z_2 \to z_1 = z}} \int_{-\infty}^{\infty}\int_{-\infty}^{\infty}\int_{-\infty}^{\infty} a(k_{x_1}, k_{x_2}, k_y) e^{ik_{x_1}x_1 + ik_{x_2}x_2 + ik_y y}$$

$$e^{\sqrt{k_{x_1}^2 + k_y^2}\, z_1 - \sqrt{k_{x_2}^2 + k_y^2}\, z_2} dk_{x_1} dk_{x_2} dk_y.$$

18. The external field response distribution visualization device according to claim 6, wherein
in a three-dimensional space of x-coordinates, y-coordinates, and z-coordinates, the virtual induction position is expressed as $(x_1, y, z_1)$, the virtual sensing position is expressed as $(x_2, y, z_2)$, a z-coordinate of a position of the one or more induction circuits is defined as 0, and a z-coordinate of a position of the one or more sensors is defined as $z_0$,
the induction position dependent field function is defined as:

[Math. 10]

$$\Phi(x_1, x_2, y, z_1, z_2) = \int_{-\infty}^{\infty}\int_{-\infty}^{\infty}\int_{-\infty}^{\infty} a(k_{x_1}, k_{x_2}, k_y)$$

$$e^{ik_{x_1}x_1 + ik_{x_2}x_2 + ik_y y} e^{-\sqrt{k_{x_1}^2 + k_y^2}\, z_1 - \sqrt{k_{x_2}^2 + k_y^2}\, z_2} dk_{x_1} dk_{x_2} dk_y,$$

$$a(k_{x_1}, k_{x_2}, k_y) = e^{z_0 \sqrt{k_{x_2}^2 + k_y^2}} \Phi(k_{x_1}, k_{x_2}, k_y, z_1 = 0, z_2 = z_0),$$

a Fourier transform image of the sensing result is expressed as:

$$\Phi(k_{x_1}, k_{x_2}, k_y, z_1=0, z_2=z_0) \quad \text{[Math. 11]}$$

where $k_{x_1}$, $k_{x_2}$, and $k_y$ are respective wavenumbers of $x_1$, $x_2$, and $y$, and
the imaging function is defined as:

[Math. 12]

$$\varphi(x, y, z) = \lim_{\substack{x_2 \to x_1 = x \\ z_2 \to z_1 = z}} \Phi(x_1, x_2, y, z_1, z_2) =$$

$$\lim_{\substack{x_2 \to x_1 = x \\ z_2 \to z_1 = z}} \int_{-\infty}^{\infty}\int_{-\infty}^{\infty}\int_{-\infty}^{\infty} a(k_{x_1}, k_{x_2}, k_y) e^{ik_{x_1}x_1 + ik_{x_2}x_2 + ik_y y}$$

$$e^{-\sqrt{k_{x_1}^2 + k_y^2}\, z_1 - \sqrt{k_{x_2}^2 + k_y^2}\, z_2} dk_{x_1} dk_{x_2} dk_y.$$

19. The external field response distribution visualization device according to claim 1, wherein
the information processing circuit determines whether the object includes a detection target object based on the image, and when the object is determined to include the detection target object, outputs information indicating a location of the detection target object or the object to an external terminal.

20. An external field response distribution visualization method of generating an image showing an external field response distribution, which is a distribution of responses to an external field, the external field response distribution visualization method comprising:
sequentially inducing, by one or more induction circuits, a first field component from each of actual induction positions defined outside of an object as positions relative to the object;
sensing, by one or more sensors, at each of actual sensing positions defined outside of the object as positions relative to the object, a strength of a field including a second field component induced from the object by the first field component sequentially induced from each of the actual induction positions, to sense the strength of the field at the actual sensing positions for each of the actual induction positions; and
obtaining a sensing result of the strength of the field and generating the image showing the external field response distribution of an area including an interior of the object based on the sensing result, wherein
the obtaining and generating includes:
deriving an induction position dependent field function that takes a virtual induction position and a virtual sensing position as inputs and outputs a strength of the field at the virtual sensing position, using the sensing result as a boundary condition;
deriving an imaging function that takes an imaging target position as an input and outputs an image intensity at the imaging target position, and is defined based on a strength output from the induction position dependent field function in response to inputting the imaging target position, as the virtual induction position and the virtual sensing position, into the induction position dependent field function; and
generating the image based on the imaging function.

* * * * *